United States Patent
Sasajima et al.

(10) Patent No.: US 8,728,954 B2
(45) Date of Patent: May 20, 2014

(54) METHOD OF MANUFACTURING SEMICONDUCTOR DEVICE, SUBSTRATE PROCESSING APPARATUS, AND RECORDING MEDIUM

(71) Applicant: Hitachi Kokusai Electric Inc., Tokyo (JP)

(72) Inventors: Ryota Sasajima, Toyama (JP); Yoshinobu Nakamura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/963,027

(22) Filed: Aug. 9, 2013

(65) Prior Publication Data

US 2014/0051260 A1    Feb. 20, 2014

(30) Foreign Application Priority Data

Aug. 14, 2012 (JP) ................. 2012-179926

(51) Int. Cl.
*H01L 21/31* (2006.01)
*C23C 16/00* (2006.01)

(52) U.S. Cl.
USPC ...... 438/762; 438/770; 438/786; 118/723 ER

(58) Field of Classification Search
USPC ......... 438/761, 762, 769, 770, 771, 774, 775, 438/786; 118/723 E, 723 ER
See application file for complete search history.

(56) References Cited

U.S. PATENT DOCUMENTS

| | | | |
|---|---|---|---|
| 7,125,812 B2* | 10/2006 | Kumagai et al. | 438/778 |
| 7,820,118 B2* | 10/2010 | Yamazaki et al. | 422/198 |
| 8,076,251 B2* | 12/2011 | Akae et al. | 438/786 |
| 8,268,731 B2* | 9/2012 | Nakamura et al. | 438/770 |
| 2011/0256733 A1 | 10/2011 | Hirose et al. | |

FOREIGN PATENT DOCUMENTS

JP    2011-238894 A    11/2011

* cited by examiner

*Primary Examiner* — Kevin M Picardat
(74) *Attorney, Agent, or Firm* — Volpe and Koenig, P.C.

(57) ABSTRACT

A method of manufacturing a semiconductor device includes forming a thin film containing a specific element, oxygen, carbon, and nitrogen by performing a cycle a predetermined number of times. The cycle includes supplying a specific element-containing gas, supplying a carbon-containing gas, supplying an oxidizing gas, and supplying a nitriding gas. The act of supplying the nitriding gas is performed before the act of supplying the specific element-containing gas, and the act of supplying the carbon-containing gas and the act of supplying the oxidizing gas are not performed until the act of supplying the specific element-containing gas is performed.

12 Claims, 10 Drawing Sheets

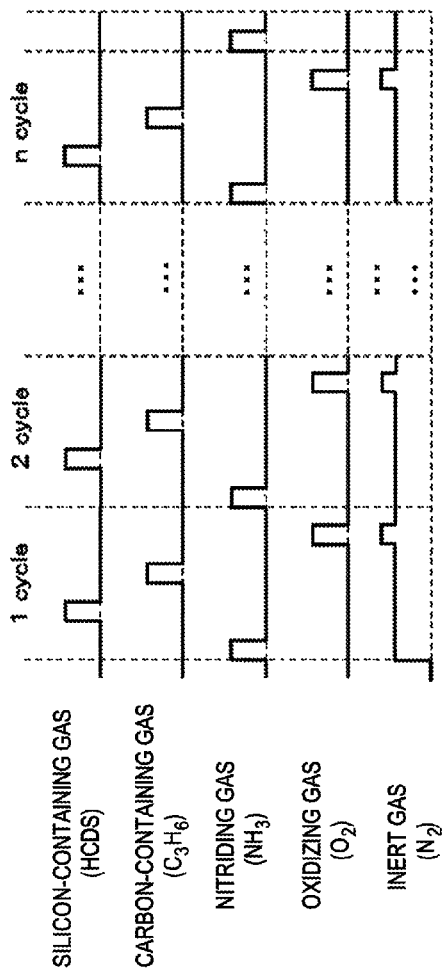

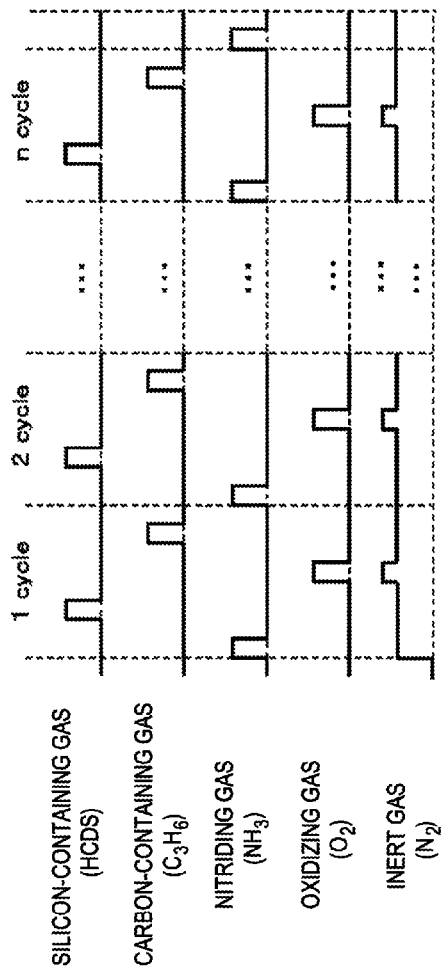

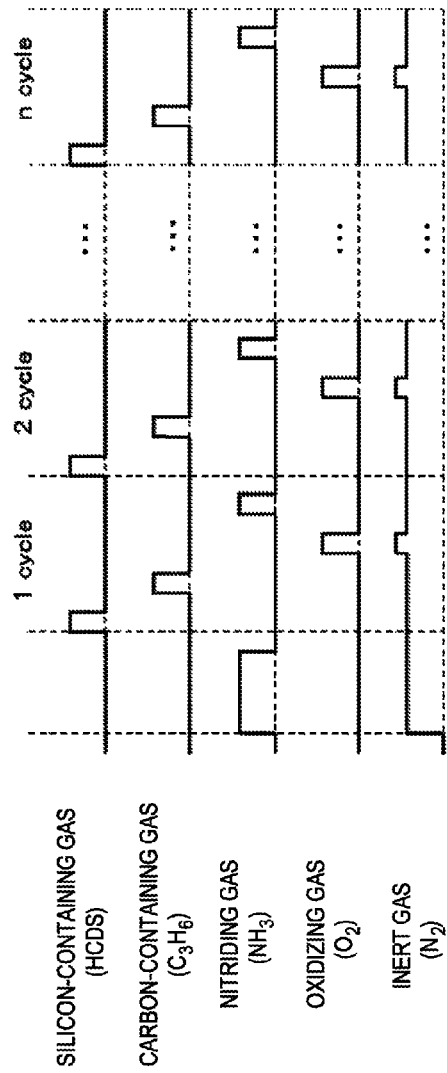

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2012-179926, filed on Aug. 14, 2012, the entire contents of which are incorporated herein by reference.

TECHNICAL FIELD

The present disclosure relates to a method of manufacturing a semiconductor device which includes a process of forming a thin film on a substrate, a substrate processing apparatus, and a recording medium.

BACKGROUND

As semiconductor devices are miniaturized in size, the demand for reducing a parasitic capacitance between a gate and a source of a transistor is increasing. For this reason, a film (e.g., low-k film) having a relatively lower dielectric constant is considered in manufacturing semiconductor devices, instead of a silicon nitride film ($Si_xN_y$ film, hereinafter simply referred to as "SiN film"), which is conventionally used as a sidewall film or the like. In a silicon oxide carbon nitride film (SiOCN film) in which oxygen (O) and carbon (C) are added into the SiN film, a low dielectric constant is realized by adding O, and a wet etching resistance or a dry etching resistance which is deteriorated by adding O can be recovered or improved by adding C.

It is known that the SiOCN film is formed, for example, by performing a cycle a predetermined number of times, the cycle including: a process of supplying a silicon-containing gas to a heated wafer in a processing chamber; a process of supplying a carbon-containing gas; a process of supplying a nitriding gas; and a process of supplying an oxidizing gas, which are sequentially performed. Recently, a high dielectric constant insulating film (high-k film) is used as a gate insulating film of transistors, and thus lowering a film-forming temperature of a thin film formed near a gate, such as a sidewall film, is increasingly required. The low temperature range may be, for example, equal to or less than 600 degrees C., for example, equal to or less than 450 degrees C. However, when the film-forming temperature is lowered to the low temperature range, a deposition rate of a thin film is reduced, causing a low productivity of semiconductor devices.

SUMMARY

The present disclosure provides some embodiments of a method of manufacturing a semiconductor device, a substrate processing apparatus, and a recording medium which can prevent a deposition rate from being reduced when forming a thin film, containing a specific element, oxygen, carbon, and nitrogen, in a low temperature range.

According to some embodiments of the present disclosure, there is provided a method of manufacturing a semiconductor device, including: forming a thin film containing a specific element, oxygen, carbon, and nitrogen on a substrate by performing a cycle a predetermined number of times, the cycle including: supplying a specific element-containing gas to the substrate; supplying a carbon-containing gas to the substrate; supplying an oxidizing gas to the substrate; and supplying a nitriding gas to the substrate, wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

According to some other embodiments of the present disclosure, there is provided a substrate processing apparatus, including: a processing chamber configured to accommodate a substrate; a specific element-containing gas supply system configured to supply a specific element-containing gas to the substrate in the processing chamber; a carbon-containing gas supply system configured to supply a carbon-containing gas to the substrate in the processing chamber; an oxidizing gas supply system configured to supply an oxidizing gas to the substrate in the processing chamber; a nitriding gas supply system configured to supply a nitriding gas to the substrate in the processing chamber; and a controller configured to control the specific element-containing gas supply system, the carbon-containing gas supply system, the oxidizing gas supply system, and the nitriding gas supply system such that a thin film containing a specific element, oxygen, carbon, and nitrogen is formed on the substrate by performing a cycle a predetermined number of times, the cycle including: supplying the specific element-containing gas to the substrate, supplying the carbon-containing gas to the substrate, supplying the oxidizing gas to the substrate, and supplying the nitriding gas to the substrate, and in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

According to yet other embodiments of the present disclosure, there is provided a non-transitory computer-readable recording medium storing a program that causes a computer to perform a process of forming a thin film containing a specific element, oxygen, carbon, and nitrogen on a substrate by performing a cycle a predetermined number of times, the cycle including: supplying a specific element-containing gas to the substrate; supplying a carbon-containing gas to the substrate; supplying an oxidizing gas to the substrate; and supplying a nitriding gas to the substrate, wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

BRIEF DESCRIPTION OF THE DRAWINGS

FIGS. 5A and 5B are timing diagrams illustrating a gas supply timing in a second sequence and a gas supply timing in a modification example of the second sequence, respectively, according to some embodiments.

FIGS. 6A and 6B are timing diagrams illustrating a gas supply timing in an example of the present disclosure and a gas supply timing in a comparative example, respectively.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Various embodiments will be now described with reference to the drawings.

(1) Configuration of Substrate Processing Apparatus

Figure 1:
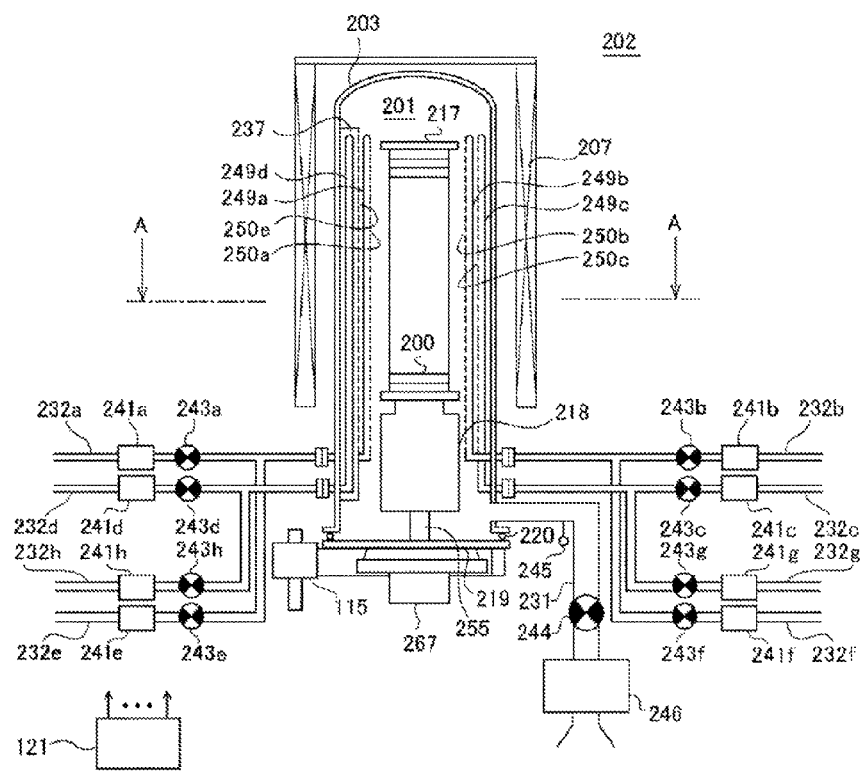
FIG. 1 is a schematic view illustrating a configuration of a vertical treatment furnace of a substrate processing apparatus, in which a portion of the treatment furnace is shown in a longitudinal sectional view, according to some embodiments.
Figure 2:
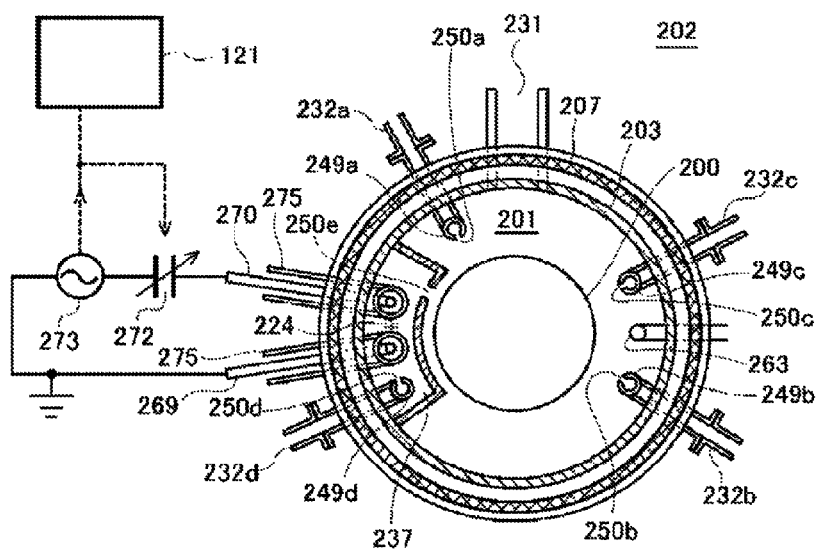
FIG. 2 is a schematic view illustrating a configuration of the vertical treatment furnace of the substrate processing apparatus, in which a portion of the treatment furnace is shown in a sectional view taken along line A-A in FIG. 1.

FIG. 1 is a schematic view illustrating a configuration of a vertical treatment furnace 202 of a substrate processing apparatus, according to some embodiments, in which a portion of the treatment furnace 202 is shown in a longitudinal sectional view. FIG. 2 is a schematic view illustrating a configuration of the vertical treatment furnace 202, according to some embodiments, in which a portion of the treatment furnace 202 is shown in a sectional view taken along line A-A in FIG. 1.

The present disclosure is not limited to the substrate processing apparatus of FIGS. 1 and 2, and may be applied to a substrate processing apparatus, for example, including a single-wafer type, hot wall type, or cold wall type treatment furnace.

As illustrated in FIG. 1, the treatment furnace 202 includes a heater 207 as a heating means (heating mechanism). The heater 207 has a cylindrical shape, and is vertically installed by being supported by a heater base (not shown) that is a holding plate. Also, as described later, the heater 207 may function as an activating mechanism that activates (excites) a gas with heat.

A reaction tube 203 configuring a reaction vessel (processing vessel) is disposed inside the heater 207 in a concentric form along the heater 207. The reaction tube 203 may be formed of, for example, a heat-resistant material such as quartz ($SiO_2$) or silicon carbide (SiC), and has a cylindrical shape with an upper end closed and a lower end opened. A processing chamber 201 is provided in a hollow cylindrical portion of the reaction tube 203, and configured to accommodate a plurality of wafers 200, which are substrates. The wafers 200 are horizontally stacked in multiple stages to be aligned in a vertical direction in a boat 217 which will be described later.

A first nozzle 249a, a second nozzle 249b, a third nozzle 249c, and a fourth nozzle 249d are installed in the processing chamber 201 to pass through a lower portion of the reaction tube 203. A first gas supply pipe 232a, a second gas supply pipe 232b, a third gas supply pipe 232c, and a fourth gas supply pipe 232d are connected to the first nozzle 249a, the second nozzle 249b, the third nozzle 249c, and the fourth nozzle 249d, respectively. As described above, the four nozzles 249a, 249b, 249c and 249d and the four gas supply pipes 232a, 232b, 232c and 232d are installed in the reaction tube 203 to supply a plurality of kinds of (4 in this example) gases into the processing chamber 201.

Moreover, a manifold (not shown) formed of metal which supports the reaction tube 203 may be installed under the reaction tube 203 such that the nozzles pass through a sidewall of the manifold formed of metal. In this case, an exhaust pipe 231 described later may be installed at the manifold formed of metal. In this case, the exhaust pipe 231 may be installed at a lower portion of the reaction tube 203 rather than at the metal manifold. As described above, a furnace port of the treatment furnace 202 may be formed of metal, and the nozzles may be mounted on the furnace port formed of metal.

A mass flow controller (MFC) 241a, which is a flow rate controller (a flow rate control part), and a valve 243a, which is an opening/closing valve, are installed at the first gas supply pipe 232a in this order from an upstream direction. Also, a first inert gas supply pipe 232e is connected to the first gas supply pipe 232a at a downstream side of the valve 243a. A mass flow controller 241e, which is a flow rate controller (a flow rate control part), and a valve 243e, which is an opening/closing valve, are installed at the first inert gas supply pipe 232e in this order from the upstream direction. In addition, the above-described first nozzle 249a is connected to a front end portion of the first gas supply pipe 232a. The first nozzle 249a is installed in an arc-shaped space between an inner wall of the reaction tube 203 and the wafers 200. The first nozzle 249a is vertically disposed along the inner wall of the reaction tube 203 to rise upward in a stacking direction of the wafers 200.

That is, the first nozzle 249a is installed in a flank of a wafer arrangement region, in which the wafers 200 are arranged. The first nozzle 249a is configured as an L-shaped long nozzle, and has a horizontal portion installed to pass through a lower sidewall of the reaction tube 203 and a vertical portion installed to rise from one end side toward the other end side of at least the wafer arrangement region. A plurality of gas supply holes 250a through which gas is supplied is formed at a side surface of the first nozzle 249a. The gas supply holes 250a are opened toward a center of the reaction tube 203 so that gas can be supplied toward the wafers 200. The gas supply holes 250a are disposed to span from a lower portion to an upper portion of the reaction tube 203 at a predetermined opening pitch. The plurality of gas supply holes 250a has the same opening area. A first gas supply system is mainly configured by the first gas supply pipe 232a, the mass flow controller 241a, and the valve 243a. Also, the first nozzle 249a may be included in the first gas supply system. In addition, a first inert gas supply system is mainly configured by the first inert gas supply pipe 232e, the mass flow controller 241e, and the valve 243e.

A mass flow controller (MFC) 241b, which is a flow rate controller (a flow rate control part), and a valve 243b, which is an opening/closing valve, are installed at the second gas supply pipe 232b in this order from the upstream direction. Also, a second inert gas supply pipe 232f is connected to the second gas supply pipe 232b at a downstream side of the valve 243b. A mass flow controller 241f, which is a flow rate controller (a flow rate control part), and a valve 243f, which is an opening/closing valve, are installed at the second inert gas supply pipe 232f in this order from the upstream direction. In addition, the above-described second nozzle 249b is connected to a front end portion of the second gas supply pipe 232b. The second nozzle 249b is installed in an arc-shaped space between the inner wall of the reaction tube 203 and the wafers 200. The second nozzle 249b is vertically disposed along the inner wall of the reaction tube 203 to rise upward in the stacking direction of the wafers 200. That is, the second nozzle 249b is installed in the flank of the wafer arrangement region, in which the wafers 200 are arranged. The second nozzle 249b is configured as an L-shaped long nozzle, and has a horizontal portion installed to pass through the lower sidewall of the reaction tube 203 and a vertical portion installed to rise from one end side toward the other end side of at least the wafer arrangement region. A plurality of gas supply holes 250b through which gas is supplied is formed at a side surface of the second nozzle 249b. The gas supply holes 250b are opened toward the center of the reaction tube 203 so that gas can be supplied toward the wafers 200. The gas supply holes 250b are disposed to span from the lower portion to the upper portion of the reaction tube 203 at a predetermined opening pitch. The plurality of gas supply holes 250b has the same opening area. A second gas supply system is mainly configured by the second gas supply pipe 232b, the mass flow controller 241b, and the valve 243b. Also, the second nozzle 249b may be included in the second gas supply system. Furthermore, a second inert gas supply system is mainly configured by the second inert gas supply pipe 232f, the mass flow controller 241f, and the valve 243f.

A mass flow controller (MFC) 241c, which is a flow rate controller (a flow rate control part), and a valve 243c, which is an opening/closing valve, are installed at the third gas supply pipe 232c in this order from the upstream direction. Also, a third inert gas supply pipe 232g is connected to the third gas supply pipe 232c at a downstream side of the valve 243c. A mass flow controller 241g, which is a flow rate controller (a flow rate control part), and a valve 243g, which is an opening/closing valve, are installed at the third inert gas supply pipe 232g in this order from the upstream direction. In addition, the above-described third nozzle 249c is connected to a front end portion of the third gas supply pipe 232c. The third nozzle 249c is installed in an arc-shaped space between the inner wall of the reaction tube 203 and the wafers 200. The third nozzle 249c is vertically disposed along the inner wall of the reaction tube 203 to rise upward in the stacking direction of the wafers 200. That is, the third nozzle 249c is installed at the flank of the wafer arrangement region, in which the wafers 200 are arranged. The third nozzle 249c is configured as an L-shaped long nozzle, and has a horizontal portion installed to pass through the lower sidewall of the reaction tube 203 and a vertical portion installed to rise from one end side toward the other end side of at least the wafer arrangement region. A plurality of gas supply holes 250c through which gas is supplied is formed at a side surface of the second nozzle 249b. The gas supply holes 250c are opened toward the center of the reaction tube 203 so that gas can be supplied toward the wafers 200. The gas supply holes 250c are disposed to span from the lower portion to the upper portion of the reaction tube 203 at a predetermined opening pitch. The plurality of gas supply holes 250c has the same opening area. A third gas supply system is mainly configured by the third gas supply pipe 232c, the mass flow controller 241c, and the valve 243c. In addition, the third nozzle 249c may be included in the third gas supply system. Furthermore, a third inert gas supply system is mainly configured by the third inert gas supply pipe 232g, the mass flow controller 241g and the valve 243g.

A mass flow controller (MFC) 241d, which is a flow rate controller (a flow rate control part), and a valve 243d, which is an opening/closing valve, are installed at the fourth gas supply pipe 232d in this order from the upstream direction. Also, a fourth inert gas supply pipe 232h is connected to the fourth gas supply pipe 232d at a downstream side of the valve 243d. A mass flow controller 241h, which is a flow rate controller (a flow rate control part), and a valve 243h, which is an opening/closing valve, are installed at the fourth gas supply pipe 232h in this order from the upstream direction. In addition, the above-described fourth nozzle 249d is connected to a front end portion of the fourth gas supply pipe 232d. The fourth nozzle 249c is installed in a buffer chamber 237 that is a gas diffusion space.

The buffer chamber 237 is installed in an arc-shaped space between an inner wall of the reaction tube 203 and the wafers 200. The buffer chamber 237 is vertically disposed along the inner wall of the reaction tube 203 in the stacking direction of the wafers 200. That is, the buffer chamber 237 is installed in the flank of the wafer arrangement region. A plurality of gas supply holes 250e through which gas is supplied is formed at an end portion of a wall adjacent to the wafers 200. The gas supply holes 250e are opened toward the center of the reaction tube 203 so that gas can be supplied toward the wafers 200. The gas supply holes 250e are disposed to span from the lower portion to the upper portion of the reaction tube 203 at a predetermined opening pitch. The plurality of gas supply holes 250e has the same opening area.

The fourth nozzle 249d is installed between an end portion, in which the gas supply holes 250e are formed, and an opposite end portion of the buffer chamber 237. The fourth nozzle 249d is vertically disposed along the inner wall of the reaction tube 203 to rise upward in the stacking direction of the wafers 200. That is, the fourth nozzle 249d is installed at the flank of the wafer arrangement region, in which the wafers 200 are arranged. The third nozzle 249c is configured as an L-shaped long nozzle, and has a horizontal portion installed to pass through the lower sidewall of the reaction tube 203 and a vertical portion installed to rise from one end side toward the other end side of at least the wafer arrangement region. A plurality of gas supply holes 250d through which gas is supplied is formed at a side surface of the fourth nozzle 249d. The gas supply holes 250d, similarly to the gas supply holes 250e of the buffer chamber 237, are disposed to span from the lower portion to the upper portion of the reaction tube 203. The plurality of gas supply holes 250 may have the same opening area and the same opening pitch from an upstream side (lower portion) to a downstream side (upper portion) when a pressure difference between the inside of the buffer chamber 237 and the inside of the processing chamber 201 is small, but when the pressure difference is large, the opening area of each of the plurality of gas supply holes 250e may be set larger, and the opening pitch of each gas supply hole 250e may be set smaller at the downstream side than the upstream side.

By adjusting the opening area or opening pitch of each gas supply hole 250e of the fourth nozzle 249d from the upstream side to the downstream as described above, gases may be ejected at the almost same flow rate from the respective gas supply holes 250d despite there being a flow velocity difference. The gases ejected from the respective gas supply holes 250d are first introduced into the buffer chamber 237, and a flow velocity difference of the gases is uniformized in the buffer chamber 237. The gases ejected from the respective gas supply holes 250d of the fourth nozzle 249d into the buffer chamber 237 are mitigated in particle velocity, and then are ejected from the respective gas supply holes 250e of the buffer chamber 237 into the processing chamber 201. Therefore, the gases ejected from the respective gas supply holes 250d of the fourth nozzle 249d into the buffer chamber 237 have a uniform flow rate and flow velocity when the gases are ejected from the respective gas supply holes 250e of the buffer chamber 237 into the processing chamber 201.

A fourth gas supply system is mainly configured by the fourth gas supply pipe 232d, the mass flow controller 241d, and the valve 243d. Also, the fourth nozzle 249d and the buffer chamber 237 may be included in the fourth gas supply system. In addition, a fourth inert gas supply system is mainly configured by the fourth inert gas supply pipe 232h, the mass flow controller 241h, and the valve 243h. The fourth inert gas supply system functions as a purge gas supply system.

Gas that is supplied may be transferred via the nozzles 249a, 249b, 249c and 249d and buffer chamber 237 disposed in an arc-shaped longitudinal space defined by the inner wall of the reaction tube 203 and end portions of the plurality of stacked wafers 200, the gas is first ejected into the reaction tube 203 near the wafers 200 through the gas supply holes 250a, 250b, 250c, 250d and 250e opened in the nozzles 249a, 249b, 249c, and 249d and buffer chamber 237, respectively, and thus, a main flow of the gas in the reaction tube 203 follows a direction parallel to surfaces of the wafers 200, namely, the horizontal direction. With this configuration, the gas can be uniformly supplied to the wafers 200, and thus, a film thickness of a thin film formed on each of the wafers 200 can be uniformized. In addition, a residual gas after reaction flows toward an exhaust port, for example, the exhaust pipe 231, but a flow direction of the residual gas may be appropriately specified by a position of the exhaust port without being limited to the vertical direction.

A silicon raw material gas (i.e., a silicon-containing gas containing silicon (Si)) such as a chlorosilane-based raw material gas, for example, is supplied as a specific element-containing gas from the first gas supply pipe 232a into the processing chamber 201 through the mass flow controller 241a, the valve 243a, and the first nozzle 249a. A hexachlorodisilane ($Si_2Cl_6$, abbreviation: HCDS) gas, for example, may be used as the silicon-containing gas. Also, when a liquid raw material having a liquid state is used like HCDS under a normal temperature and a normal pressure, the liquid raw material is vaporized by a vaporization system such as a vaporizer or a bubbler, and supplied as a raw material gas (HCDS gas).

A carbon-containing gas, namely, a gas containing carbon (C), is supplied from the second gas supply pipe 232b into the processing chamber 201 through the mass flow controller 241b, the valve 243b, and the second nozzle 249b. A hydrocarbon-based gas such as propylene ($C_3H_6$) gas, for example, may be used as the carbon-containing gas.

An oxidizing gas, namely, a gas (oxygen-containing gas) containing oxygen (O), is supplied from the third gas supply pipe 232c into the processing chamber 201 through the mass flow controller 241c, the valve 243c, and the third nozzle 249c. An oxygen ($O_2$) gas, for example, may be used as the oxidizing gas.

A nitriding gas, namely, a gas (nitrogen-containing gas) containing nitrogen (N), is supplied from the fourth gas supply pipe 232d into the processing chamber 201 through the mass flow controller 241d, the valve 243d, and the fourth nozzle 249d. An ammonia ($NH_3$) gas, for example, may be used as the nitriding gas.

A nitrogen ($N_2$) gas, for example, is supplied from the inert gas supply pipes 232e, 232f, 232g and 232h into the processing chamber 201 through the mass flow controllers 241e, 241f, 241g and 231h, the valves 243e, 243f, 243f and 243h, the gas supply pipes 232a, 232b, 232c and 232d, the nozzles 249a, 249b, 249c and 249d, and the buffer chamber 237, respectively.

Moreover, for example, when the above-described gases flow through the respective gas supply pipes, a specific element-containing gas supply system, for example, a silicon-containing gas supply system (silane-based gas supply system), is configured by the first gas supply system. Also, a carbon-containing gas supply system is configured by the second gas supply system. Also, an oxidizing gas supply system, namely, an oxygen-containing gas supply system, is configured by the third gas supply system. Also, a nitriding gas supply system, namely, a nitrogen-containing gas supply system, is configured by the fourth gas supply system. Also, the specific element-containing gas supply system is simply referred to as a raw material gas supply system or a raw material supply system. Also, when the carbon-containing gas, the oxidizing gas, and the nitriding gas are collectively referred to as a reaction gas, a reaction gas supply system is configured by the carbon gas supply system, the oxidizing gas supply system, and the nitriding gas supply system.

In the buffer chamber 237, as illustrated in FIG. 2, a first rod-shaped electrode 269 that is a first electrode having an elongated structure and a second rod-shaped electrode 270 that is a second electrode having an elongated structure are disposed along the stacking direction of the wafers 200 from the lower portion to the upper portion of the reaction tube 203. Each of the first rod-shaped electrode 269 and second rod-shaped electrode 270 is disposed in parallel to the fourth nozzle 249d. Each of the first rod-shaped electrode 269 and second rod-shaped electrode 270 is covered and protected by an electrode protection tube 275 that is a protection tube for protecting each of the electrodes from an upper portion to a lower portion thereof. One of the first rod-shaped electrode 269 and second rod-shaped electrode 270 is connected to a high-frequency power source 273 through a matcher 272, and the other is connected to a ground corresponding to a reference electric potential. By applying high-frequency power from the high-frequency power source 273 to the first rod-shaped electrode 269 and the second rod-shaped electrode 270 through the matcher 272, plasma is generated in a plasma generation region 224 between the first rod-shaped electrode 269 and the second rod-shaped electrode 270. Mainly, a plasma source that is a plasma generator (plasma generating part) is configured by the first rod-shaped electrode 269, the second rod-shaped electrode 270, and the electrode protection tube 275. Also, the matcher 272 and the high-frequency power source 273 may be included in the plasma source. Also, as described later, the plasma source functions as an activating mechanism (exciting part) that activates (excites) a gas to plasma.

The electrode protection tube 275 has a structure in which the first rod-shaped electrode 269 and the second rod-shaped electrode 270 are able to be inserted into the buffer chamber 237 in a state where the first rod-shaped electrode 269 and the second rod-shaped electrode 270 are isolated from an internal atmosphere of the buffer chamber 237. Here, when an internal oxygen concentration of the electrode protection tube 275 is equal to an oxygen concentration in an ambient air (atmosphere), the first rod-shaped electrode 269 and second rod-shaped electrode 270 inserted into the electrode protection tube 275 are oxidized by heat generated by the heater 207. Therefore, by charging the inside of the electrode protection tube 275 with an inert gas such as nitrogen gas, or by purging the inside of the electrode protection tube 275 with an inert gas such as nitrogen gas using an inert gas purging mechanism, the internal oxygen concentration of the electrode protection tube 275 decreases, thus preventing oxidation of the first rod-shaped electrode 269 or the second rod-shaped electrode 270.

The exhaust pipe 231 for exhausting an internal atmosphere of the processing chamber 201 is installed at the reaction tube 203. A vacuum exhaust device, for example, vacuum pump 246, is connected to the exhaust pipe 231 through a pressure sensor 245, which is a pressure detector (pressure detecting part) for detecting an internal pressure of the processing chamber 201, and an auto pressure controller (APC) valve 244 that is a pressure regulator (pressure regulating part). The APC valve 244 is a valve configured to perform/stop vacuum exhaustion in the processing chamber 201 by opening/closing the valve with the vacuum pump 246 actuated and adjust the internal pressure of the processing chamber 201 by regulating a degree of the valve opening with the vacuum pump 246 actuated. Mainly, an exhaust system is configured by the exhaust pipe 231, the APC valve 244, and the pressure sensor 245. Also, the vacuum pump 246 may be included in the exhaust system. The exhaust system may adjust the degree of valve opening of the APC valve 244 on the basis of pressure information detected by the pressure sensor 245 while operating the vacuum pump 246, thereby vacuum-exhausting the inside of the processing chamber 201 such that the internal pressure of the processing chamber 201 becomes a predetermined pressure (vacuum level).

A seal cap 219, which functions as a furnace port cover for air-tightly sealing a lower end opening of the reaction tube 203, is installed under the reaction tube 203. The seal cap 219 contacts the lower end of the reaction tube 203 from below in the vertical-direction. The seal cap 219, for example, may be formed of metal such as stainless to have a disc shape. An O-ring 220 contacting the lower end of the reaction tube 203 is disposed as a seal member at a top of the seal cap 219. A rotary mechanism 267 for rotating the boat 217 is installed as a later-described substrate holder, below the seal cap 219. A rotary shaft 255 of the rotary mechanism 267 is connected to the boat 217 through the seal cap 219. The rotary mechanism 267 rotates the boat 217 to rotate the wafers 200. The seal cap 219 is vertically lowered and raised by a boat elevator 115 that is vertically disposed as an elevation mechanism outside the reaction tube 203. The boat elevator 115 may lower and raise the seal cap 219 to enable the boat 217 to be loaded and unloaded into and from the processing chamber 201. That is, the boat elevator 115 is configured as a transferring device (transferring mechanism) that transfers the boat 217, namely, the wafers 200, to inside and outside the processing chamber 201.

The boat 217, which is used as a substrate support, is formed of a heat-resistant material such as quartz or silicon carbide, and configured to support the wafers 200 horizontally stacked in multiple stages with the center of the wafers 200 concentrically aligned. In addition, a heat insulating member 218 formed of a heat-resistant material such as quartz or silicon carbide is installed at a lower portion of the boat 217, and configured such that heat from the heater 207 cannot be transferred to the seal cap 219. In addition, the heat insulating member 218 may be constituted by a plurality of heat insulating plates formed of a heat-resistant material such as quartz or silicon carbide, and a heat insulating plate holder configured to support the heat insulating plates in a horizontal posture in a multi-stage manner.

A temperature sensor 263 as a temperature detector is installed in the reaction tube 203. Based on temperature information detected by the temperature sensor 263, a state of electric conduction to the heater 207 is adjusted such that the interior of the processing chamber 201 has an intended temperature distribution. The temperature sensor 263 is configured in an L-shape similarly to the nozzles 249a, 249b, 249c and 249d, and installed along the inner wall of the reaction tube 203.

Figure 3:
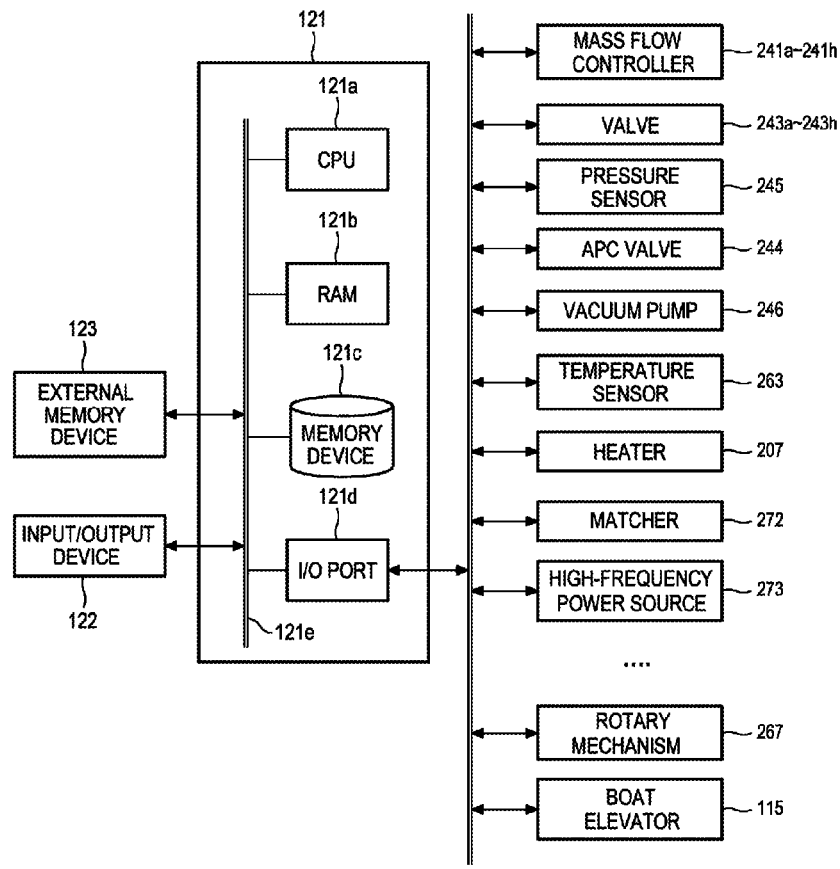
FIG. 3 is a block diagram illustrating a configuration of a controller of the substrate processing apparatus, according to some embodiments.

As illustrated in FIG. 3, a controller 121, which is a control unit (a control part), is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a through an internal bus 121e. An input/output device 122 including, for example, a touch panel, is connected to the controller 121.

The memory device 121c is configured by, for example, a flash memory, a hard disk drive (HDD), or the like. A control program for controlling an operation of the substrate processing apparatus or a process recipe, in which a sequence or condition for processing a substrate described later is written, is readably stored in the memory device 121c. Also, the process recipe functions as a program to cause the controller 121 to execute each sequence in the substrate processing process described later to obtain a predetermined result. Hereinafter, the process recipe or control program may be generally simply referred to as a program. Also, when the term "program" is used herein, it may include a case in which the process recipe is solely included, a case in which the control program is solely included, or a case in which both of these are included. In addition, the RAM 121b is configured as a memory area (work area) in which a program or data read by the CPU 121a is temporarily stored.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the high-frequency power source 273, the matcher 272, the rotary mechanism 267, the boat elevator 115, etc.

The CPU 121a is configured to read and execute the control program from the memory device 121c and read the process recipe from the memory device 121c according to input of an operation command from the input/output device 122. In addition, the CPU 121a is configured to control flow rate controlling operations of various gases by the mass flow controllers 241a, 241b, 241c, 241d, 241e, 241f, 241g and 241h, opening/closing operations of the valves 243a, 243b, 243c, 243d, 243e, 243f, 243g and 243h, an opening/closing operation of the APC valve 244 and a pressure regulating operation by the APC valve 244 based on the pressure sensor 245, a temperature regulating operation of the heater 207 based on the temperature sensor 263, start and stop of the vacuum pump 246, a rotation and rotation speed adjusting operation of the boat 217 by the rotary mechanism 267, an elevation operation of the boat 217 by the boat elevator 115, supply of power by the high-frequency power source 273, an impedance adjusting operation of the matcher 272, etc., according to contents of the read process recipe.

Moreover, the controller 121 is not limited to being configured as an exclusive computer but may be configured as a general-purpose computer. For example, the controller 121 can be configured by preparing an external memory device 123 (for example, a magnetic tape, a magnetic disk such as a flexible disk or a hard disk, an optical disk such as a CD or DVD, a magneto-optical disk such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 may be configured as a non-transitory computer-readable recording medium, which is readable by a computer. Hereinafter, these means for supplying the program will be simply referred to as a recording medium. In addition, when the term "recording medium" is used herein, it may include a case in which the memory device 121c is solely included, a case in which the external memory device 123 is solely included, or a case in which both of these are included.

(2) Substrate Processing Process

Next, a sequence of forming a thin film on a substrate, which is one of the processes of manufacturing a semiconductor device by using the treatment furnace 202 of the above-described substrate processing apparatus, will be described. In addition, in the following description, operations of the respective parts constituting the substrate processing apparatus are controlled by the controller 121.

Moreover, in order to form a composition ratio of a film to be formed as a stoichiometric composition or another predetermined composition ratio different from the stoichiometric composition, supply conditions of a plurality of kinds of gases containing a plurality of elements constituting the film to be formed are controlled. For example, the supply conditions are controlled such that at least one element of the plurality of elements configuring the film to be formed stoichiometrically exceeds another element. Hereinafter, a sequence of forming a film while controlling a ratio of the plurality of elements constituting the film to be formed, namely, a composition ratio of the film, will be described.

(First Sequence)

First, a first sequence will be described.

Figure 4A:
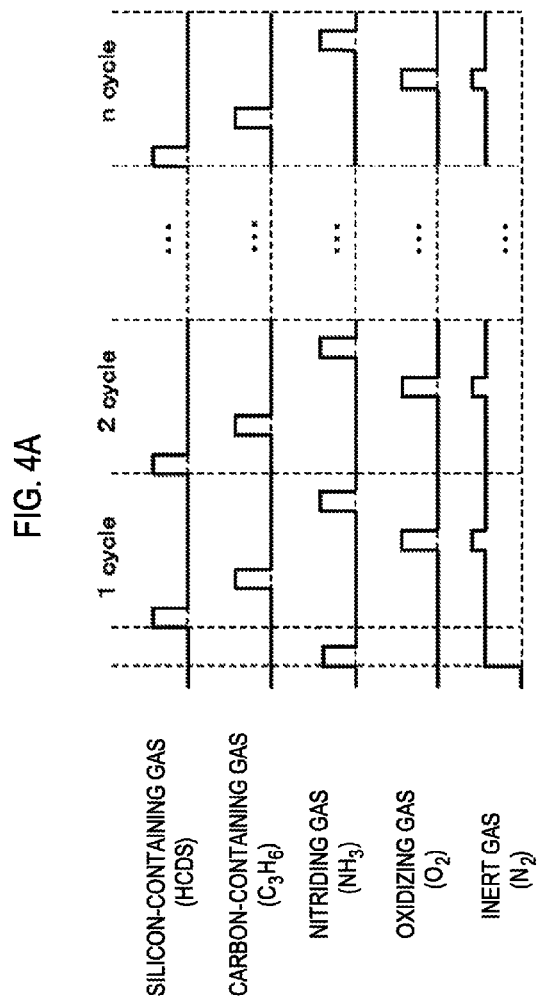
FIGS. 4A and 4B are timing diagrams illustrating a gas supply timing in a first sequence and a gas supply timing in a modification example of the first sequence, respectively, according to some embodiments.

FIG. 4A is a view showing a gas supply timing in the first sequence, according to some embodiments.

In the first sequence, a thin film containing a specific element, oxygen, carbon, and nitrogen is formed on the wafer 200 by performing a cycle a predetermined number of times, the cycle including a process of supplying a specific element-containing gas to the wafers 200, a process of supplying a carbon-containing gas to the wafer 200, a process of supplying an oxidizing gas to the wafer 200, and a process of supplying a nitriding gas to the wafer 200.

In addition, in the process of forming the thin film, the process of supplying the nitriding gas is performed before performing the process of supplying the specific element-containing gas, and the process of supplying the carbon-containing gas and the process of supplying the oxidizing gas are not performed until the process of supplying the specific element-containing gas is performed after the process of supplying the nitriding gas is performed. Specifically, the process of supplying the nitriding gas is performed, and then a cycle including the process of supplying the specific element-containing gas, the process of supplying the carbon-containing gas, and the process of supplying the oxidizing gas, and the process of supplying the nitriding gas is performed a predetermined number of times.

More specifically, the process of supplying the nitriding gas is performed, and then the process of supplying the specific element-containing gas, the process of supplying the carbon-containing gas, the process of supplying the oxidizing gas, and the process of supplying the nitriding gas are sequentially performed. The four sequentially performed processes are set as being included in one cycle, which is performed a predetermined number of times. The predetermined number of times may be a plurality of times.

Hereinafter, the first sequence will be described in detail. Here, an HCDS gas is used as the specific element-containing gas, a $C_3H_6$ gas is used as the carbon-containing gas, an $O_2$ gas is used as the oxidizing gas, and an $NH_3$ gas is used as the nitriding gas. The following description will be made on an example that forms a silicon oxide carbon nitride film (SiOCN film) containing silicon, oxygen, carbon, and nitrogen on the wafer 200 in the film-forming sequence of FIG. 4A, namely, a film-forming sequence in which a process of supplying the $NH_3$ gas is performed and then a cycle in which a process of supplying the HCDS gas, a process of supplying the $C_3H_6$ gas, a process of supplying the $O_2$ gas, and a process of supplying the $NH_3$ gas are sequentially performed is performed a predetermined number of times.

In addition, when the term "wafer" is used herein, it may refer to "the wafer itself" or "the wafer and a stacked body (a collected body) of predetermined layers or films formed on the surface" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, namely, the uppermost surface of the wafer, which is a stacked body."

Accordingly, when "a predetermined gas is supplied to a wafer" is written herein, it may mean that "a predetermined gas is directly supplied to a surface (exposed surface) of a wafer itself" or that "a predetermined gas is supplied to a layer or a film formed on a wafer, namely, on the uppermost surface of a wafer as a stacked body." Also, when "a predetermined layer (of film) is formed on a wafer" is written herein, it may mean that "a predetermined layer (or film) is directly formed on a surface (an exposed surface) of a wafer itself" or that "a predetermined layer (or film) is formed on a layer or a film formed on a wafer, namely, on the uppermost surface of a wafer as a stacked body."

Moreover, the term "substrate" as used herein may be synonymous with the term "wafer", and in this case, the terms "wafer" and "substrate" may be used interchangeably.

(Wafer Charge and Boat Load)

When the plurality of wafers 200 are charged on the boat 217 (wafer charging), as illustrated in FIG. 1, the boat 217 supporting the plurality of wafers 200 is raised by the boat elevator 115 to be loaded into the processing chamber 201 (boat loading). In this state, the seal cap 219 seals the lower end of the reaction tube 203 via the O-ring 220.

(Pressure Adjustment and Temperature Adjustment)

The interior of the processing chamber 201 is vacuum-exhausted by the vacuum pump 246 to a desired pressure (vacuum level). Here, the pressure in the processing chamber 201 is measured by the pressure sensor 245, and the APC valve 244 is feedback-controlled based on the measured pressure information (pressure adjustment). Also, the vacuum pump 246 maintains a regular operation state at least until processing of the wafers 200 is terminated. Further, the processing chamber 201 is heated by the heater 207 to a desired temperature. Here, an electrical conduction to the heater 207 is feedback-controlled based on the temperature information detected by the temperature sensor 263 until the interior of the processing chamber 201 reaches a desired temperature distribution (temperature adjustment). In addition, heating of the interior of the processing chamber 201 by the heater 207 is continuously performed at least until processing of the wafers 200 is terminated. Next, the boat 217 and the wafers 200 begin to be rotated by the rotary mechanism 267 (wafer rotation). Furthermore, the rotation of the boat 217 and the wafers 200 by the rotary mechanism 267 is continuously performed at least until processing of the wafers 200 is terminated.
(Process of Forming Silicon Oxycarbonitride Film)

Next, a surface modification step which will be described later is performed, and then four steps which will be described later, namely, Steps 1 to 4, are sequentially performed.
[Surface Modification Step]
($NH_3$ Gas Supply)

The valve 243d of the fourth gas supply pipe 232d is opened to flow the $NH_3$ gas in the fourth gas supply pipe 232d. A flow rate of the $NH_3$ gas flowing in the fourth gas supply pipe 232d is regulated by the mass flow controller 241d. The flow rate-controlled $NH_3$ gas is supplied into the processing chamber 201 through the gas supply holes 250d of the fourth nozzle 249d. At this time, the high-frequency power is not applied between the first rod-shaped electrode 269 and the second rod-shaped electrode 270. Thus, the $NH_3$ gas supplied into the buffer chamber 237 is activated by heat, supplied into the processing chamber 201 through the gas supply holes 250a, and exhausted through the exhaust pipe 231. At this time, the $NH_3$ gas activated by heat is supplied to the wafer 200. Also, at this time, by applying the high-frequency power between the first rod-shaped electrode 269 and the second rod-shaped electrode 270, the $NH_3$ gas supplied into the buffer chamber 237 may be activated by plasma and then supplied to the wafer 200. In this case, the high-frequency power applied from the high-frequency power source 273 between the first rod-shaped electrode 269 and the second rod-shaped electrode 270 is set to fall within a range of, for example, 50 to 1,000 W. Other processing conditions are similar to a processing condition (described later) in a case in which the $NH_3$ gas is activated by heat and supplied.

At the same time, the valve 243h is opened to flow a $N_2$ gas into the fourth inert gas supply pipe 232h. The $N_2$ gas flowing in the fourth inert gas supply pipe 232h is supplied into the processing chamber 201 through the buffer chamber 237 together with the $NH_3$ gas, and exhausted through the exhaust pipe 231. At this time, in order to prevent infiltration of the $NH_3$ gas into the first nozzle 249a, the second nozzle 249b, and the third nozzle 249c, the valves 243e, 243f and 243g are opened to flow the $N_2$ gas into the first inert gas supply pipe 232e, the second inert gas supply pipe 232f, and the third inert gas supply pipe 232g. The $N_2$ gas is supplied into the processing chamber 201 through the first gas supply pipe 232a, the second gas supply pipe 232b, the third gas supply pipe 232c, the first nozzle 249a, the second nozzle 249b, and the third nozzle 249c, and exhausted through the exhaust pipe 231.

When flowing the $NH_3$ gas that is activated by heat, the APC valve 244 is appropriately adjusted to change the internal pressure of the processing chamber 201 to a pressure within a range of, for example, 1 to 6,000 Pa. A supply flow rate of the $NH_3$ gas controlled by the mass flow controller 241d is set to fall within a range of, for example, 100 to 10,000 sccm. Supply flow rates of the $N_2$ gas controlled by the mass flow controllers 241h, 241e, 241f and 241g are set to fall within a range of, for example, 100 to 10,000 sccm. Here, a partial pressure of the $NH_3$ gas in the processing chamber 201 is set to fall within a range of, for example, 0.01 to 5941 Pa. A time for supplying the $NH_3$ gas to the wafer 200, namely, a gas supply time (irradiation time), is set to fall within a range of, for example, 1 to 600 seconds. Also, a time for supplying the $NH_3$ gas in the surface modification step may be, for example, set to be longer than a time for supplying the $NH_3$ gas in a later-described step 4. Thus, surface modification (described later) may be sufficiently performed on the uppermost surface of the wafer 200 before forming a film. In this case, a temperature of the heater 207 is set such that a temperature of the wafer 200 falls within a range of, for example, 250 to 700 degrees C. or more specifically, for example 300 to 650 degrees C. Since the $NH_3$ gas has a high reaction temperature and is difficult to react at the above-described wafer temperature, by setting the internal pressure of the processing chamber 201 to the above-described relatively high pressure, it is possible to thermally activate the $NH_3$ gas. Also, when the $NH_3$ gas is activated by heat and supplied, a soft reaction can be caused, and thus, the surface modification to be described later may be softly performed.

The uppermost surface of the wafer 200 is modified (surface modification) by supplying the activated $NH_3$ gas to the uppermost surface (base surface when forming the SiOCN film) of the wafer 200. At this time, for example, the uppermost surface of the wafer 200 may react with the activated $NH_3$ gas to be nitrided, and thus, a layer having Si—N bonding, namely, a nitride layer (silicon nitride layer) containing silicon (Si) and nitrogen (N) may be formed at the uppermost surface of the wafer 200. Also, for example, the $NH_3$ gas may be adsorbed onto the uppermost surface of the wafer 200, and thus, an adsorption layer of the $NH_3$ gas may be formed at the uppermost surface of the wafer 200. In addition, such reactions are performed at the same time, and the nitride layer and the adsorption layer of the $NH_3$ gas may be formed at both sides of the uppermost surface of the wafer 200, respectively.

The nitride layer includes a discontinuous layer in addition to a continuous layer containing Si and Cl. That is, the nitride layer includes a layer having a thickness of less than one atomic layer including Si—N bonding to several atomic layers. Also, the adsorption layer of the $NH_3$ gas includes a chemisorption layer in which gas molecules of the $NH_3$ gas are discontinuous, in addition to a chemisorption layer in which the gas molecules of the $NH_3$ gas are continuous. That is, the adsorption layer of the $NH_3$ gas includes a chemisorption layer having a thickness of one molecular layer containing $NH_3$ gas molecules or less than one molecular layer. Also, the $NH_3$ gas molecules constituting the adsorption layer of the $NH_3$ contain molecules in which bonding of N and H is partially broken ($N_xH_y$ molecules). That is, the adsorption layer of the $NH_3$ gas includes a chemisorption layer, in which the $NH_3$ gas molecules and/or the $N_xH_y$ molecules are continuous, or a chemisorption layer in which the $NH_3$ gas molecules and/or the $N_xH_y$ molecules are discontinuous. Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer.

The uppermost surface of the wafer 200 after surface modification has a surface state in which it is easy for HCDS gas supplied in later-described step 1 to be adsorbed onto the uppermost surface, and it is easy for Si to be deposited on the uppermost surface. That is, the $NH_3$ gas used in the surface modification step acts as an adsorption and deposition facilitating gas that facilitates adsorption or deposition of the HCDS gas or Si onto the uppermost surface of the wafer 200.
(Residual Gas Removal)

Thereafter, the valve 243d of the fourth gas supply pipe 232d is closed to stop the supply of the $NH_3$ gas. Here, the APC valve 244 of the exhaust pipe 231 is in an open state, and the interior of the processing chamber 201 is vacuum-exhausted by the vacuum pump 246 to remove unreacted $NH_3$ gas (or the $NH_3$ gas which remains after contributing to the surface modification of the wafer 200) and reaction byproducts remaining in the processing chamber 201. Also, at this time, the valves 243h, 243e, 243f and 243g are in an open state, and the supply of the $N_2$ gas into the processing chamber 201 is maintained. In this case, the unreacted $NH_3$ gas (or the $NH_3$ gas which remains after contributing to the surface modification of the wafer 200) and the reaction byproducts remaining in the processing chamber 201 can be more effectively removed from the inside of the processing chamber 201.

Moreover, in this case, the gas remaining in the processing chamber 201 may not be completely removed, and the interior of the processing chamber 201 may not be completely purged. When the gas remaining in the processing chamber 201 is very small in amount, there is no adverse effect generated in Step 1 performed thereafter. Here, a flow rate of the $N_2$ gas supplied into the processing chamber 201 need not be a large flow rate, and for example, approximately the same volume of the $N_2$ gas as the reaction tube 203 (processing chamber 201) may be supplied into the processing chamber 201 to purge the interior of the processing chamber 201 such that there is no adverse effect generated in Step 1. As described above, as the interior of the processing chamber 201 is not completely purged, the purge time can be reduced to improve a throughput. In addition, consumption of the $N_2$ gas can be suppressed to a minimal necessity.

The nitriding gas may include a diazene ($N_2H_2$) gas, a hydrazine ($N_2H_4$) gas, an $N_3H_8$ gas, or the like, in addition to the ammonia ($NH_3$) gas. The inert gas may include a rare gas such as an Ar gas, a He gas, a Ne gas, a Xe gas, or the like, in addition to the $N_2$ gas.

[Step 1]
(HCDS Gas Supply)

After the surface modification step is terminated and the residual gas in the processing chamber 201 is removed, the valve 243a of the first gas supply pipe 232a is opened to flow the HCDS gas in the first gas supply pipe 232a. A flow rate of the HCDS gas flowing in the first gas supply pipe 232a is regulated by the mass flow controller 241a. The flow rate-regulated HCDS gas is supplied into the processing chamber 201 through the gas supply holes 250a of the first nozzle 249a, and exhausted through the exhaust pipe 231. At this time, the HCDS gas is supplied to the wafer 200.

At the same time, the valve 243e is opened to flow the inert gas such as the $N_2$ gas into the first inert gas supply pipe 232e. A flow rate of the $N_2$ gas flowing in the first inert gas supply pipe 232e is regulated by the mass flow controller 241e. The flow rate-regulated $N_2$ gas is supplied into the processing chamber 201 with the HCDS gas, and exhausted through the exhaust pipe 231. In addition, here, in order to prevent infiltration of the HCDS gas into the second nozzle 249b, the third nozzle 249c, the fourth nozzle 249d, and the buffer chamber 237, the valves 243f, 243g and 243h are opened to flow the $N_2$ gas into the second inert gas supply pipe 232f, the third inert gas supply pipe 232g, and the fourth inert gas supply pipe 232h. The $N_2$ gas is supplied into the processing chamber 201 through the second gas supply pipe 232b, the third gas supply pipe 232c, the fourth gas supply pipe 232d, the second nozzle 249b, the third nozzle 249c, the fourth nozzle 249d, and the buffer chamber 237, and exhausted through the exhaust pipe 231.

At this time, the APC valve 244 is appropriately adjusted to change the internal pressure of the processing chamber 201 to fall within a range of, for example, 1 to 13,300 Pa, and more specifically, for example 20 to 1,330 Pa. A supply flow rate of the HCDS gas controlled by the mass flow controller 241a is set to fall within a range of, for example, 1 to 1,000 sccm. Supply flow rates of the $N_2$ gas controlled by the mass flow controllers 241e, 241f, 241g and 241h are set to fall within a range of, for example, 100 to 10,000 sccm. A time of supplying the HCDS gas to the wafer 200, namely, a gas supply time (irradiation time), is set to fall within a range of, for example, 1 to 200 seconds. This range may be more specifically, for example, 1 to 120 seconds or 1 to 60 seconds. At this time, a temperature of the heater 207 is set such that a temperature of the wafer 200 is set to fall within a range of, for example, 250 to 700 degrees C. This range may be more specifically, for example, 300 to 650 degrees C. or 350 to 600 degrees C. Also, when the temperature of the wafer 200 is less than 250 degrees C., it becomes difficult for the HCDS gas to be adsorbed onto the wafer 200, and for this reason, a practical deposition rate cannot be obtained. This problem can be solved by setting the temperature of the wafer 200 to 250 degrees C. or more. Also, the HCDS can be more sufficiently adsorbed onto the wafer 200 by setting the temperature of the wafer 200 to 300 degrees C. or more, and a more sufficient deposition rate can be obtained. Also, when the temperature of the wafer 200 exceeds 700 degrees C., a CVD reaction is strengthened (a gaseous reaction becomes dominant), and thus, a film thickness uniformity may be easily deteriorated to make it difficult to control the film thickness uniformity. By regulating the temperature of the wafer to 700 degrees C. or less, deterioration of the film thickness uniformity can be prevented, and thus, it is possible to control the film thickness uniformity. In particular, when a surface reaction becomes dominant by regulating the temperature of the wafer 200 to 650 degrees C. or less, the film thickness uniformity can be easily secured, and thus, it becomes easy to control the film thickness uniformity. Accordingly, the temperature of the wafer 200 may be set to fall within a range of 250 to 700 degrees C., for example, within 300 to 650 degrees C.

By supplying the HCDS gas to the wafer 200, a silicon-containing layer having a thickness of about less than one atomic layer to several atomic layers is formed as a first layer on the uppermost surface of the wafer 200 which has been modified by the $NH_3$ gas in the surface modification step. The silicon-containing layer may be an adsorption layer of the HCDS gas, a silicon layer (Si layer), or both of these. However, the silicon-containing layer may, for example, be a layer containing silicon (Si) and chlorine (Cl).

Here, the silicon layer is a generic name including a discontinuous layer in addition to a continuous layer formed of silicon (Si), or a silicon thin film formed by overlapping them. Also, a continuous layer formed of Si may be referred to as the silicon thin film. In addition, Si constituting the silicon layer includes Si in which bonding to Cl is not completely broken.

Moreover, the adsorption layer of the HCDS gas includes a chemisorption layer in which gas molecules of the HCDS gas are discontinuous, in addition to the chemisorption layer in which the gas molecules of the HCDS gas are continuous. That is, the adsorption layer of the HCDS gas includes a chemisorption layer having a thickness of one molecular layer containing HCDS molecules or less than one molecular layer. Also, HCDS ($Si_2Cl_6$) molecules constituting the adsorption layer of the HCDS gas contains molecules in which bonding of Si and Cl is partially broken ($Si_xCl_y$ molecules). That is, the adsorption layer of the HCDS includes a chemisorption layer in which $Si_2Cl_6$ molecules and/or $Si_xCl_y$ molecules are continuous, or a chemisorption layer in which $Si_2Cl_6$ molecules and/or $Si_xCl_y$ molecules are discontinuous. Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer.

Under conditions in which the HCDS gas is autolyzed (pyrolyzed), i.e., under conditions in which a pyrolysis reaction of the HCDS occurs, the silicon layer containing Cl is formed by depositing Si on the wafer 200. Under conditions in which the HCDS gas is not autolyzed (pyrolyzed), namely, under conditions in which a pyrolysis reaction of the HCDS does not occur, the adsorption layer of the HCDS gas is formed by adsorbing the HCDS gas onto the wafer 200. In addition, formation of the adsorption layer of the HCDS gas on the wafer 200 can increase the film-forming rate more than formation of the silicon layer containing Cl on the wafer 200.

When the thickness of the silicon-containing layer formed on the wafer 200 exceeds several atomic layers, an effect of modification in Steps 3 and 4 described later is not applied to the entire silicon-containing layer. In addition, a minimum value of the thickness of the silicon-containing layer that can be formed on the wafer 200 is less than one atomic layer. Accordingly, the thickness of the silicon-containing layer may be less than one atomic layer to several atomic layers. In addition, as the thickness of the silicon-containing layer is one atomic layer or less, namely, one atomic layer or less than one atomic layer, an effect of the modification reaction in Steps 3 and 4 described later can be relatively increased, and a time required for the modification reaction in Steps 3 and 4 can be reduced. A time for forming the silicon-containing layer in Step 1 can be reduced. As a result, a processing time per one cycle can be reduced, and a total processing time can also be reduced. That is, the film-forming rate can also be increased. In addition, as the thickness of the silicon-containing layer is one atomic layer or less, a controllability of the film thickness uniformity can also be increased.

(Residual Gas Removal)

After the silicon-containing layer is formed, the valve 243a of the first gas supply pipe 232a is closed to stop the supply of the HCDS gas. At this time, the APC valve 244 of the exhaust pipe 231 is in an open state, and the interior of the processing chamber 201 is vacuum-exhausted by the vacuum pump 246 to remove unreacted HCDS gas (or the HCDS gas which remains after contributing to the formation of the silicon-containing layer) or reaction byproducts remaining in the processing chamber 201. Also, at this time, the valves 243e, 243f, 243g and 243h are in an open state, and maintain the supply of the $N_2$ gas (inert gas) into the processing chamber 201. The $N_2$ gas acts as a purge gas, and thus the unreacted HCDS gas (or the HCDS gas which remains after contributing to the formation of the silicon-containing layer) or reaction byproducts remaining in the processing chamber 201, can be more effectively removed from the inside of the processing chamber 201.

Moreover, in this case, the gas remaining in the processing chamber 201 may not be completely removed, and the interior of the processing chamber 201 may not be completely purged. When the gas remaining in the processing chamber 201 is very small in amount, there is no adverse effect generated in Step 2 performed thereafter. Here, a flow rate of the $N_2$ gas supplied into the processing chamber 201 need not be a large flow rate, and for example, approximately the same volume of the $N_2$ gas as the reaction tube 203 (processing chamber 201) may be supplied to perform the purge such that there is no adverse effect generated in Step 2. As described above, as the interior of the processing chamber 201 is not completely purged, the purge time can be reduced to improve a throughput. In addition, consumption of the $N_2$ gas can be suppressed to a minimal necessity.

The silicon-containing gas may include an inorganic raw material gas such as a tetrachlorosilane, namely, a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas, a monosilane ($SiH_4$) gas, or the like, in addition to a hexachlorodisilane ($Si_2Cl_6$, abbreviation: HCDS) gas, or use an organic raw material gas such as an aminosilane-based tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamido)silane ($Si[N(C_2H_5)_2]_2H_2$, abbreviation: 2DEAS) gas, or a bis tertiary butyl amino silane ($SiH_2[NH(C_4H_9)]_2$, abbreviation: BTBAS) gas, or the like. The inert gas may include a rare gas such as an Ar gas, a He gas, a Ne gas, a Xe gas, or the like, in addition to the $N_2$ gas.

[Step 2]

($C_3H_6$ Gas Supply)

After Step 1 is terminated and the residual gas in the processing chamber 201 is removed, the valve 243d of the second gas supply pipe 232b is opened to flow the $C_3H_6$ gas in the second gas supply pipe 232b. A flow rate of the $C_3H_6$ gas flowing in the second gas supply pipe 232b is regulated by the mass flow controller 241b. The flow rate-regulated $C_3H_6$ gas is supplied into the processing chamber 201 through the gas supply holes 250b of the second nozzle 249b. The $C_3H_6$ gas supplied into the processing chamber 201 is activated by heat, and exhausted through the exhaust pipe 231. At this time, the $C_3H_6$ gas activated by heat is supplied to the wafer 200.

At the same time, the valve 243f is opened to flow the $N_2$ gas into the second inert gas supply pipe 232f. The $N_2$ gas flowing in the second inert gas supply pipe 232f is supplied into the processing chamber 201 together with the $C_3H_6$ gas, and exhausted through the exhaust pipe 231. Also, at this time, in order to prevent infiltration of the $C_3H_6$ gas into the first nozzle 249a, the third nozzle 249c, the fourth nozzle 249d, and the buffer chamber 237, the valves 243e, 243g and 243h are opened to flow the $N_2$ gas into the first inert gas supply pipe 232e, the third inert gas supply pipe 232g, and the fourth inert gas supply pipe 232h. The $N_2$ gas is supplied into the processing chamber 201 through the first gas supply pipe 232a, the third gas supply pipe 232c, the fourth gas supply pipe 232d, the first nozzle 249a, the third nozzle 249c, the fourth nozzle 249d, and the buffer chamber 237, and exhausted through the exhaust pipe 231.

At this time, the APC valve 244 is appropriately adjusted to change the internal pressure of the processing chamber 201 to fall within a range of, for example, 1 to 6,000 Pa. A supply flow rate of the $C_3H_6$ gas controlled by the mass flow controller 241b is set to fall within a range of, for example, 100 to 10,000 sccm. Supply flow rates of the $N_2$ gas controlled by the mass flow controllers 241f, 241e, 241g and 241h are set to fall within a range of, for example, 100 to 10,000 sccm. Here, a partial pressure of the $C_3H_6$ gas in the processing chamber 201 is set to fall within a range of, for example, 0.01 to 5941 Pa. A time for supplying the $C_3H_6$ gas to the wafer 200, namely, a gas supply time (irradiation time), is set to fall within a range of, for example, 1 to 200 seconds. This range may be more specifically, for example, 1 to 120 seconds or 1 to 60 seconds. In this case, similarly to Step 1, a temperature of the heater 207 is set such that a temperature of the wafer 200 falls within a range of, for example, 250 to 700 degrees C., or more specifically, for example, 300 to 650 degrees C. Also, when the $C_3H_6$ gas is activated by heat and supplied, a soft reaction can be caused, and thus, it becomes easy to form a carbon-containing layer described later.

At this time, the gas flowing into the processing chamber 201 is the thermally activated $C_3H_6$ gas, and the HCDS gas does not flow into the processing chamber 201. Accordingly, the $C_3H_6$ gas does not cause a gaseous reaction, and the activated $C_3H_6$ gas is supplied to the wafer 200, and a carbon-containing layer having a thickness of less than one atomic layer, namely, a discontinuous carbon-containing layer is formed on the silicon-containing layer as the first layer formed on the wafer 200 in Step 1. That is, a second layer containing silicon and carbon, namely, a layer in which a carbon-containing layer is formed on the silicon-containing layer, is formed. Also, depending on a condition, the $C_3H_6$ gas may react with a portion of the silicon-containing layer, and thus, the silicon-containing layer is modified (carbonized) to form the second layer containing silicon and carbon.

The carbon-containing layer formed on the silicon-containing layer may be a carbon layer (C layer), or may be an adsorption layer of a carbon-containing gas ($C_3H_6$ gas), namely, a chemisorption layer of a material ($C_xH_y$) into which the $C_3H_6$ gas is decomposed. Here, the carbon layer needs be a discontinuous layer formed of carbon. Also, the chemisorption layer of $C_xH_y$ needs be a discontinuous chemisorption layer of $C_xH_y$ molecules. Also, when the carbon-containing layer formed on the silicon-containing layer is a continuous layer, for example, when a continuous chemisorption layer of $C_xH_y$ is formed on the silicon-containing layer by changing an adsorption state on a silicon-containing layer of $C_xH_y$ to a saturation state, a surface of the silicon-containing layer is overall covered by the chemisorption layer of $C_xH_y$. In this case, there is no silicon on a surface of the second layer, and thus, it can become possible to cause an oxidation reaction of the second layer in Step 3 described later or cause a nitridation reaction of a third layer in Step 4 described later. Under the above-described processing conditions, nitrogen or oxygen is bonded to silicon, but it is difficult to bond to carbon. For this reason, in order to cause a desired oxidation reaction or nitridation reaction, an adsorption state on the silicon-containing layer of $C_xH_y$ is changed to an unstauration state, and it is required to expose silicon to the surface of the second layer.

The processing conditions in Step 2 are set to the above-described processing conditions in order to change the adsorption state on the silicon-containing layer of $C_xH_y$ to the unstauration state, but by setting the processing conditions in Step 2 to the following processing conditions, it becomes easy to change the adsorption state on the silicon-containing layer of $C_xH_y$ to the unstauration state.

Wafer temperature: 500 to 650 degrees C.
Pressure in processing chamber: 133 to 5,332 Pa
Partial pressure of $C_3H_6$ gas: 33 to 5,177 Pa
Supply flow rate of $C_3H_6$ gas: 1,000 to 10,000 sccm
Supply flow rate of $N_2$ gas: 300 to 3,000 sccm
$C_3H_6$ gas supply time: 6 to 200 seconds
(Residual Gas Removal)

After the second layer is formed, the valve 243b of the second gas supply pipe 232b is closed to stop the supply of the $C_3H_6$ gas. At this time, the interior of the processing chamber 201 is vacuum-exhausted by the vacuum pump 246 in a state in which the APC valve 244 of the exhaust pipe 231 is open, and unreacted $C_3H_6$ gas (or the $C_3H_6$ gas which remains after contributing to the formation of the second layer) or reaction byproducts remaining in the processing chamber 201 is removed from the processing chamber 201. Also, at this time, the valves 243f, 243e, 243g and 243f are in an open state, and the supply of the $N_2$ gas (inert gas) into the processing chamber 201 is maintained. The $N_2$ gas acts as a purge gas, and thus the unreacted $C_3H_6$ gas (or the $C_3H_6$ gas which remains after contributing to the formation of the second layer) or reaction byproducts remaining in the processing chamber 201 can be more effectively removed from the processing chamber 201.

Moreover, in this case, the gas remaining in the processing chamber 201 may not be completely removed, and the interior of the processing chamber 201 may not be completely purged. When the amount of gas remaining in the processing chamber 201 is very small, there is no adverse effect generated in Step 3 performed thereafter. Here, the flow rate of the $N_2$ gas supplied into the processing chamber 201 need not be a large flow rate, and for example, approximately the same volume of the $N_2$ gas as the reaction tube 203 (the processing chamber 201) may be supplied to perform the purge such that there is no adverse effect generated in Step 2. As described above, as the interior of the processing chamber 201 is not completely purged, the purge time can be reduced to improve a throughput. In addition, consumption of the $N_2$ gas can also be suppressed to a minimal necessity.

The carbon-containing gas may include a hydrocarbon-based gas such as an acetylene ($C_2H_2$) gas, an ethylene ($C_2H_4$) gas, or the like, in addition to the propylene ($C_3H_6$) gas.

[Step 3]
($O_2$ Gas Supply)

After Step 2 is terminated and the residual gas in the processing chamber 201 is removed, the valve 243c of the third gas supply pipe 232c is opened to flow the $O_2$ gas in the third gas supply pipe 232c. A flow rate of the $O_2$ gas flowing in the third gas supply pipe 232c is regulated by the mass flow controller 241c. The flow rate-regulated $O_2$ gas is supplied into the processing chamber 201 through the gas supply holes 250c of the third nozzle 249c, and exhausted through the exhaust pipe 231. At this time, the $O_2$ gas is supplied to the wafer 200.

At the same time, the valve 243g is opened to flow the $N_2$ gas into the third inert gas supply pipe 232g. The $N_2$ gas flowing in the third inert gas supply pipe 232g is supplied into the processing chamber 201 together with the $O_2$ gas, and exhausted through the exhaust pipe 231. Also, at this time, in order to prevent infiltration of the $O_2$ gas into the first nozzle 249a, the second nozzle 249b, the fourth nozzle 249d, and the buffer chamber 237, the valves 243e, 243f and 243h are opened to flow the $N_2$ gas into the first inert gas supply pipe 232e, the second inert gas supply pipe 232f, and the fourth inert gas supply pipe 232h. The $N_2$ gas is supplied into the processing chamber 201 through the first gas supply pipe 232a, the second gas supply pipe 232b, the fourth gas supply pipe 232d, the first nozzle 249a, the second nozzle 249b, the fourth nozzle 249d, and the buffer chamber 237, and exhausted through the exhaust pipe 231.

At this time, the APC valve 244 is appropriately adjusted to change the internal pressure of the processing chamber 201 to fall within a range of, for example, 1 to 6,000 Pa. A supply flow rate of the $O_2$ gas controlled by the mass flow controller 241c is set to fall within a range of, for example, 100 to 10,000 sccm. Supply flow rates of the $N_2$ gas controlled by the mass flow controllers 241g, 241e, 241f and 241h are set to fall within a range of, for example, 100 to 10,000 sccm. In this case, a partial pressure of the $O_2$ gas in the processing chamber 201 is set to fall within a range of, for example, 0.01 to 5941 Pa. A time for supplying the $O_2$ gas to the wafer 200, namely, a gas supply time (irradiation time), is set to fall within a range of, for example, 1 to 200 seconds. This range may include more specifically, for example, 1 to 120 seconds or 1 to 60 seconds. In this case, similarly to Steps 1 and 2, a temperature of the heater 207 is set such that a temperature of the wafer 200 falls within a range of, for example, 250 to 700 degrees C., or more specifically, for example, 300 to 650 degrees C. The $O_2$ gas is thermally activated under the above-described conditions. Also, when the $O_2$ gas is activated by heat and supplied, a soft reaction can be caused, and thus, oxidation described later can be softly performed.

In this case, the gas flowing into the processing chamber 201 is the thermally activated $O_2$ gas, and neither the HCDS gas nor the $C_3H_6$ gas flows in the processing chamber 201. Accordingly, the $O_2$ gas does not cause a gaseous reaction, and the activated $O_2$ gas is supplied to the wafer 200 and reacts with at least a portion of the second layer (layer in which the carbon-containing layer is formed on the silicon-containing layer) containing silicon and carbon which has been formed on the wafer 200 in Step 2. Therefore, the second layer is thermally oxidized by non-plasma, and thereby changed (modified) into the third layer containing silicon, oxygen, and carbon, namely, to a silicon oxide carbon layer (SiOC layer).

In this case, the oxidation reaction of the second layer is not saturated. For example, when a silicon-containing layer having a thickness of several atomic layers is formed in Step 1 and a carbon-containing layer having a thickness of one atomic layer is formed in Step 2, at least a portion of a surface layer thereof (one atomic layer of a surface) is oxidized. In this case, in order for all of the second layer not to be oxidized, the oxidation is performed under a condition in which the oxidation reaction of the second layer is unsaturated. Also, depending on a condition, some layers may be oxidized downward from the surface layer of the second layer, but when only the surface layer is oxidized, a controllability of a composition ratio of the SiOCN film can be enhanced. In addition, for example, when a silicon-containing layer having a thickness of one atomic layer or less than one atomic layer is formed in Step 1 and a carbon-containing layer having a thickness of less than one atomic layer is formed in Step 2, a portion of a surface layer thereof is also oxidized. Even in this case, in order for all of the second layer not to be oxidized, the oxidation is performed under a condition in which the oxidation reaction of the second layer is unsaturated.

In addition, the processing conditions in Step 3 are set to the above-described processing conditions in order for the oxidation reaction of the second layer to be unsaturated, but by setting the processing conditions in Step 3 to the following processing conditions, it becomes easy for the oxidation reaction of the second layer to be unsaturated.

Wafer temperature: 500 to 650 degrees C.
  Pressure in processing chamber: 133 to 5,332 Pa
  Partial pressure of $O_2$ gas: 12 to 5,030 Pa
  Supply flow rate of $O_2$ gas: 1,000 to 5,000 sccm
  Supply flow rate of $N_2$ gas: 300 to 10,000 sccm
  $O_2$ gas supply time: 6 to 200 seconds Moreover, in this case, as the above-described processing conditions are adjusted to increase a dilution rate of the $O_2$ gas (or lower a concentration of the $O_2$ gas), to shorten the supply time of the $O_2$ gas, or to lower the partial pressure of the $O_2$ gas, oxidizing power in Step 3 can be appropriately reduced, and thus, it becomes easier for the oxidation reaction of the second layer to be unsaturated. The film-forming sequence of FIG. 4A shows a state in which when a supply flow rate of the $N_2$ gas in Step 3 is higher than a supply flow rate of the $N_2$ gas in other steps, the partial pressure of $O_2$ gas is lowered, and oxidizing power is weakened.

In an oxidizing process, by weakening the oxidizing power in Step 3, it becomes easy to prevent carbon (C) from desorbing from inside the second layer. Since Si—C bonding has bonding energy higher than Si—O bonding, the Si—C bonding can be broken when Si—O bonding is formed, but by appropriately weakening the oxidizing power in Step 3, the Si—C bonding can be prevented from being broken when the Si—O bonding is formed in the second layer, and thus C that is decoupled from Si can be easily prevented from desorbing from the second layer.

In addition, the oxidizing power in Step 3 is weakened, thereby maintaining a state in which Si is exposed to the second layer after oxidation, namely, the uppermost surface of the third layer. By maintaining the state in which Si is exposed to the uppermost surface of the third layer, it becomes easy to nitride the uppermost surface of the third layer in Step 4 described later. For example, when Si—O bonding or Si—C bonding is formed all over the uppermost surface of the third layer and Si is not exposed to the uppermost surface, it is difficult to form Si—N bonding under later-described conditions of Step 4. However, under the state in which Si is exposed to the uppermost surface of the third layer is maintained, namely, Si that is able to bond to N under the later-described conditions of Step 4 is provided at the uppermost surface of the third layer, it becomes easy to form Si—N bonding.

(Residual Gas Removal)

After the third layer is formed, the valve 243c of the third gas supply pipe 232c is closed to stop the supply of the $O_2$ gas. At this time, the APC valve 244 of the exhaust pipe 231 is in an open state, and the interior of the processing chamber 201 is vacuum-exhausted by the vacuum pump 246 to remove unreacted $O_2$ gas (or the $O_2$ gas which remains after contributing to the formation of the third layer) or reaction byproducts remaining in the processing chamber 201. Also, at this time, the valves 243g, 243e, 243f and 243h are in an open state, and the supply of the $N_2$ gas (inert gas) into the processing chamber 201 is maintained. The $N_2$ gas acts as a purge gas, and thus the unreacted $O_2$ gas (or the $O_2$ gas which remains after contributing to the formation of the third layer) or reaction byproducts remaining in the processing chamber 201 can be more effectively removed from the inside of the processing chamber 201.

Moreover, in this case, the gas remaining in the processing chamber 201 may not be completely removed, and the interior of the processing chamber 201 may not be completely purged. When the gas remaining in the processing chamber 201 is very small in amount, there is no adverse effect generated in Step 4 performed thereafter. Here, a flow rate of the $N_2$ gas supplied into the processing chamber 201 need not be a large flow rate, and for example, approximately the same volume of the $N_2$ gas as the reaction tube 203 (processing chamber 201) may be supplied to perform the purge such that there is no adverse effect generated in Step 4. As described above, as the interior of the processing chamber 201 is not completely purged, the purge time can be reduced to improve a throughput. In addition, consumption of the $N_2$ gas can be suppressed to a minimal necessity.

An oxidizing gas may include a water vapor ($H_2O$) gas, a nitric oxide (NO) gas, a nitrous oxide ($N_2O$) gas, a nitrogen dioxide ($NO_2$) gas, a carbon monoxide (CO) gas, a carbon dioxide ($CO_2$) gas, an ozone ($O_3$) gas, a hydrogen ($H_2$) gas+ an $O_2$ gas, a $H_2$ gas+an $O_3$ gas, or the like, in addition to the oxygen ($O_2$) gas.

[Step 4]

($NH_3$ Gas Supply)

After Step 3 is terminated and the residual gas in the processing chamber 201 is removed, the $NH_3$ gas activated by heat is supplied to the wafer 200. In this case, a processing condition and a processing sequence are the almost same as a processing condition and a processing sequence in supplying the $NH_3$ gas in the above-described surface modification step. However, a time for supplying the $NH_3$ gas to the wafer 200, namely, a gas supply time (irradiation time), is set to fall within a range of, for example, 1 to 200 seconds. This range may be more specifically, for example, 1 to 120 seconds or 1 to 60 seconds. Also, even in Step 4, the $NH_3$ gas is activated by heat and supplied. When the $NH_3$ gas is activated by heat and supplied, a soft reaction can be caused, and thus, nitridation described later can be softly performed. However, similarly to the above-described surface modification step, the $NH_3$ gas may be activated by plasma and supplied.

In this case, the gas flowing into the processing chamber 201 is the thermally activated $NH_3$ gas, and any of the HCDS gas, the $C_3H_6$ gas, the $O_2$ gas does not flow in the processing chamber 201. Accordingly, the $NH_3$ gas does not cause a gaseous reaction, and the activated $NH_3$ gas is supplied to the wafer 200 and reacts with at least a portion of a layer (which is the third layer formed on the wafer 200 on Step 3) containing silicon, oxygen, and carbon. Therefore, the third layer is thermally nitrided by non-plasma, and thereby changed (modified) to a fourth layer containing silicon, oxygen, carbon, and nitrogen, namely, to a silicon oxide carbon nitride layer (SiOCN layer).

Moreover, the uppermost surface of the third layer is modified by supplying the activated $NH_3$ gas to the wafer 200 (surface modification). At this time, for example, the uppermost surface of the third layer reacts with the activated $NH_3$ gas to be nitrided, and thus a layer having Si—N bonding, namely, a nitride layer (silicon nitride layer) containing Si and N, may be formed at the uppermost surface of the third layer, namely, the uppermost layer of the fourth layer. Also, the $NH_3$ gas is adsorbed onto the uppermost surface of the third layer, and thus an adsorption layer of the $NH_3$ gas may be formed at the uppermost surface of the third layer, namely, the uppermost layer of the fourth layer. In addition, such reactions may be caused at the same time, and the nitride layer and the adsorption layer of the $NH_3$ gas may be respectively formed at both sides of the uppermost surface of the wafer 200, namely, the uppermost layer of the fourth layer.

The third layer after surface modification, namely, the uppermost surface of the fourth layer, has a surface state in which the HCDS gas supplied in subsequent Step 1 is easily adsorbed and Si is easily deposited. That is, the $NH_3$ gas used in Step 4 acts as an adsorption and deposition facilitating gas that facilitates adsorption or deposition of the HCDS gas or Si onto the uppermost surface of the wafer 200 (uppermost surface of the fourth layer) in a next cycle.

Moreover, in this case, the nitridation reaction of the third layer is not saturated. For example, when the third layer having a thickness of several atomic layers in Steps 1 to 4, at least a portion of a surface layer thereof (one atomic layer of a surface) is nitrided. In this case, in order for all of the third layer not to be nitrided, the nitridation is performed under a condition in which the nitridation reaction of the third layer is unsaturated. Also, depending on a condition, some layers may be nitrided downward from the surface layer of the third layer, but when only the surface layer is nitrided, a controllability of the composition ratio of the SiOCN film can be enhanced. In addition, for example, even when the third layer having a thickness of one atomic layer or less than one atomic layer in Steps 1 to 3, a portion of the surface layer is also nitrided. Even in this case, in order for all of the third layer not to be nitrided, the nitridation is performed under a condition in which the nitridation reaction of the third layer is unsaturated.

In addition, the processing conditions in Step 4 are set to the above-described processing conditions in order for the nitridation reaction of the third layer to be unsaturated, but by setting the processing conditions in Step 4 to the following processing conditions, it becomes easy for the nitridation reaction of the third layer to be unsaturated.

Wafer temperature: 500 to 650 degrees C.
Pressure in processing chamber: 133 to 5,332 Pa
Partial pressure of $NH_3$ gas: 33 to 5,030 Pa
Supply flow rate of $NH_3$ gas: 1,000 to 5,000 sccm
Supply flow rate of $N_2$ gas: 300 to 3,000 sccm
$NH_3$ gas supply time: 6 to 200 seconds (Residual Gas Removal)

After the fourth layer is formed, the interior of the processing chamber 201 is vacuum-exhausted by the vacuum pump 246 to remove unreacted $NH_3$ gas (or the $NH_3$ gas which remains after contributing to the formation of the fourth layer) or reaction byproducts remaining in the processing chamber 201. In this case, a processing condition and a processing sequence are the same as a processing condition and a processing sequence in removing the residual gas in the above-described surface modification step.

A nitriding gas, similarly to the surface modification step, may include a diazene ($N_2H_2$) gas, a hydrazine ($N_2H_4$) gas, an $N_3H_8$ gas, or the like, in addition to the ammonia ($NH_3$) gas.

The above-described Steps 1 to 4 may be set as being included in one cycle, and by performing the cycle one or more times (i.e., predetermined number of times), a thin film (i.e., a silicon oxycarbonitride film (SiOCN film)) containing silicon, oxygen, carbon, and nitrogen and having a predetermined film thickness may be formed on the wafer 200. Also, the above-described cycle may be performed a plurality of times. In this case, a ratio of element components of the SiOCN layer, namely, a ratio of a silicon component, an oxygen component, a carbon component, and a nitrogen component, namely, a silicon concentration, an oxygen concentration, a carbon concentration, and a nitrogen concentration, may be regulated by controlling a processing condition such as the internal pressure of the processing chamber 201, the gas supply time, or the like in each step, thereby controlling a composition ratio of the SiOCN film. Also, when the cycle is performed a plurality of times, the phrase "a predetermined gas is supplied to the wafer 200" in each step after at least two cycles means "a predetermined gas is supplied to a layer formed on the wafer 200, namely, the uppermost surface of the wafer 200, which is a stacked body," and the phrase "a predetermined layer is formed on the wafer 200" means "a predetermined layer is formed on a layer formed on the wafer 200, namely, the uppermost surface of the wafer 200, which is a stacked body." In addition, the above-described matters are similar in other film-forming sequences or modification examples described later.

(Purge and Return to Atmospheric Pressure)

When a film-forming process of forming the SiOCN film having a predetermined film thickness and a predetermined composition is performed, the inert gas such as the $N_2$ gas is supplied into the processing chamber 201 and exhausted, and the interior of the processing chamber 201 is purged with the inert gas (purge). Thereafter, an atmosphere in the processing chamber 201 is substituted with the inert gas (inert gas substitution), and the pressure in the processing chamber 201 returns to the atmospheric pressure (return to atmospheric pressure).

(Boat Unload and Wafer Discharge)

Thereafter, the seal cap 219 is lowered by the boat elevator 115 to open the lower end of the reaction tube 203, and the processed wafer 200 supported by the boat 217 is unloaded to the outside of the reaction tube 203 through the lower end of the reaction tube 203 (boat unload). Then, the processed wafer 200 is discharged from the boat 217 (wafer discharge).

(Second Sequence)

Next, a second sequence will be described.

FIG. 5A is a timing diagram illustrating a gas supply timing in the second sequence, according to some embodiments.

In the second sequence described above, a cycle including a process of supplying a nitriding gas, a process of supplying a specific element-containing gas, a process of supplying a carbon-containing gas, and a process of supplying an oxidizing gas is performed a predetermined number of times, and then a process of supplying the nitriding gas is performed. This differs from the above-described first sequence.

More specifically, the process of supplying the nitriding gas, the process of supplying the specific element-containing gas, the process of supplying the carbon-containing gas, and the process of supplying the oxidizing gas are sequentially performed. The four sequentially performed processes are set as being included in one cycle. The one cycle is performed a predetermined number of times, for example a plurality of times, and then the process of supplying the nitriding gas is performed.

That is, the process of supplying the nitriding gas is performed before performing the process of supplying the specific element-containing gas. The process of supplying the carbon-containing gas and the process of supplying the oxidizing gas are not performed until the process of supplying the specific element-containing gas is performed after the process of supplying the nitriding gas is performed. This is similar to the above-described first sequence.

Hereinafter, the second sequence will be described in detail. Here, the HCDS gas is used as the specific element-containing gas, the $C_3H_6$ gas is used as the carbon-containing gas, the $O_2$ gas is used as the oxidizing gas, and the $NH_3$ gas is used as the nitriding gas. The following description is made on an example that forms a silicon oxide carbon nitride film (SiOCN film) containing silicon, oxygen, carbon, and nitrogen on the wafer 200 in the film-forming sequence of FIG. 5A, namely, the film-forming sequence in which the cycle, in which the process of supplying the $NH_3$ gas, the process of supplying the HCDS gas, the process of supplying the $C_3H_6$ gas, and the process of supplying the $O_2$ gas are sequentially performed, is performed a predetermined number of times, and then the process of supplying the $NH_3$ gas is performed.

(Wafer Charge and Wafer Rotate)

Charging of a wafer, loading of a boat, regulating of a pressure, regulating of a temperature, and rotating of the wafer are performed similarly to the first sequence.

[Process of Forming Silicon Oxide Carbon Nitride Film]

Four steps described later, namely, Steps 1 to 4 are set as being included in one cycle. The one cycle is performed one or more times, and then nitridation step described later is performed.

[Step 1]

Step 1 is performed similarly to the surface modification step or Step 4 of the first sequence. The processing conditions in Step 1 are similar to processing conditions in the surface modification step or Step 4 of the first sequence.

Moreover, a reaction caused, a layer formed, etc. in Step 1 in the first cycle are similar to those in the surface modification step of the first sequence. That is, by supplying the activated $NH_3$ gas to the uppermost surface (base surface in forming the SiOCN film) of the wafer 200, the uppermost surface of the wafer 200 is changed (modified) into a surface state in which it is easy for the HCDS gas to be adsorbed onto the uppermost surface, and it is easy for Si to be deposited on the uppermost surface. That is, the nitride layer containing Si and N, the adsorption layer of the $NH_3$ gas, or both of these is/are formed at the uppermost surface of the wafer 200.

Moreover, when the cycle is performed a plurality of times, a reaction caused, a layer formed, etc. in Step 1 in each cycle subsequent to the first cycle are similar to those in the surface modification step of the first sequence. That is, in this step, at least a portion of the third layer formed in Step 4 described later is nitrided by supplying the NH3 gas into the processing chamber 201, thereby forming the fourth layer containing silicon, oxygen, carbon, and nitrogen on the wafer 200. Also, in this step, by supplying the activated $NH_3$ gas to the surface of the third layer, the uppermost surface of the fourth layer formed by nitridation of the third layer is changed (modified) into a surface state in which it is easy for the HCDS gas to be adsorbed onto the uppermost surface, and it is easy for Si to be deposited on the uppermost surface. That is, the nitride layer containing Si and N, the adsorption layer of the $NH_3$ gas, or both of these is/are formed at the uppermost surface of the fourth layer.

[Step 2]

Step 2 is performed similarly to Step 1 of the first sequence. Processing conditions, a reaction caused, a layer formed, etc. in Step 2 are similar to those in Step 1 of the first sequence. That is, in this step, for example, a silicon-containing layer (first layer) of a thickness of about less than one atomic layer to several atomic layers is formed on the wafer 200, and modified by the supply of the $NH_3$ gas, by supplying the HCDS gas into the processing chamber 201.

[Step 3]

Step 3 is performed similarly to Step 2 of the first sequence. Processing conditions, a reaction caused, a layer formed, etc. in Step 3 are similar to those in Step 2 of the first sequence. That is, in this step, by supplying the $C_3H_6$ gas into the processing chamber 201, a carbon-containing layer is formed on the silicon-containing layer that is the first layer formed in Step 2, and thus a second layer containing silicon and carbon, namely, a layer in which the carbon-containing layer is formed on the silicon-containing layer, is formed on the wafer 200.

[Step 4]

Step 4 is performed similarly to Step 3 of the first sequence. Processing conditions, a reaction caused, a layer formed, etc. in Step 4 are similar to those in Step 3 of the first sequence. That is, in this step, at least a portion of the second layer is oxidized by supplying the $O_2$ gas into the processing chamber 201, thereby forming the third layer containing silicon, oxygen, and carbon on the wafer 200.

The above-described Steps 1 to 4 may be set as being included in one cycle, and by performing the cycle one or more times, the SiOCN film of a predetermined film thickness may be formed on the wafer 200. Also, the above-described cycle may be performed a plurality of times. In this case, a ratio of element components of the SiOCN layer, namely, a ratio of a silicon component, an oxygen component, a carbon component, and a nitrogen component, namely, a silicon concentration, an oxygen concentration, a carbon concentration, and a nitrogen concentration, may be regulated by controlling a processing condition such as the internal pressure of the processing chamber 201, a gas supply time, or the like in each step, thereby controlling a composition ratio of the SiOCN film. In addition, the third layer, namely, the SiOCN layer, is formed on the uppermost surface of the SiOCN film formed in this step.

[Nitridation Step]

Steps 1 to 4 are set as being included in one cycle. The one cycle is performed a predetermined number of times, and then the nitridation step is performed. The nitridation step is performed similarly to Step 4 of the first sequence. Processing conditions, a reaction caused, a layer formed, etc. in this step are similar to those in Step 4 of the first sequence. That is, in this step, at least a portion of the third layer (SiOCN layer) formed at the uppermost surface of the wafer 200 in the final cycle is nitrided by supplying the $NH_3$ gas into the processing chamber 201, thereby changing (modifying) the third layer into the fourth layer, namely, the SiOCN layer. The SiOCN film is a film in which the uppermost surface of the SiOCN film is appropriately nitrided to thereby be modified by the nitridation step, and thus a plurality of the SiOCN layers are stacked from a lowermost layer to an uppermost layer. That is, the SiOCN film is a film having a uniform composition in a film-thickness direction.

(Gas Purge and Wafer Discharge)

When formation of the SiOCN film and modification of the uppermost surface of the SiOCN film are performed, purging of the gas, substitution with the inert gas, returning to the atmospheric pressure, unloading of the boat, and discharging of the wafer are performed similarly to the first sequence.

(3) Effects According to Some Embodiments

According to some embodiments, one or a plurality of effects are shown as described later.

(a) In all of the film-forming sequences, the process of supplying the $NH_3$ gas may be performed before performing the process of supplying the HCDS gas, and the process of supplying the $C_3H_6$ gas and the process of supplying the $O_2$ gas may not be performed until the process of supplying the HCDS gas is performed after the process of supplying the $NH_3$ gas is performed. Accordingly, even in a low temperature range, a deposition rate of the SiOCN film can increase, thus enhancing a productivity of film-forming processing.

That is, in the first sequence, Steps 1 to 4 are set as being included in one cycle, and before the one cycle is performed a predetermined number of times, the surface modification step of supplying the $NH_3$ gas to the wafer 200 is performed. Step 2 of supplying the $C_3H_6$ gas and Step 3 of supplying the $O_2$ gas are not performed between the surface modification step and Step 1. As described above, by performing the surface modification step, the uppermost surface of the wafer 200 is changed (modified) into a surface state in which it is easy for the HCDS gas to be adsorbed onto the uppermost surface, and it is easy for Si to be deposited on the uppermost surface. Step 2 or Step 3 is not performed between the surface modification step and Step 1, and thus, the uppermost surface of the wafer 200 is maintained in a surface state in which it is easy for the HCDS gas to be adsorbed onto the uppermost surface, and it is easy for Si to be deposited on the uppermost surface. Accordingly, in Step 1 performed immediately after the surface modification step, adsorption of the HCDS gas or deposition of Si onto the uppermost surface of the wafer 200 is facilitated, and it is facilitated to form a silicon-containing layer on the uppermost surface of the wafer 200.

Moreover, in the first sequence, Steps 1 to 4 are set as being included in one cycle, and when the one cycle is performed a plurality of times, Step 4 of supplying the $NH_3$ gas and Step 1 of supplying the HCDS gas are sequentially performed in succession. Thus, Step 2 of supplying the $C_3H_6$ gas and Step 3 of supplying the $O_2$ gas are not performed between Step 4 and Step 1. As described above, the uppermost surface of the fourth layer formed by performing Step 4 is changed (modified) into a surface state in which it is easy for the HCDS gas to be adsorbed onto the uppermost surface, and it is easy for Si to be deposited on the uppermost surface. Step 2 or Step 3 is not performed between Step 4 and Step 1, and thus, the uppermost surface of the fourth layer is maintained in a surface state in which it is easy for the HCDS gas to be adsorbed onto the uppermost surface, and it is easy for Si to be deposited on the uppermost surface. Accordingly, in Step 1 performed immediately after Step 4, adsorption of the HCDS gas or deposition of Si onto the uppermost surface of the fourth layer is facilitated, and it is facilitated to form a silicon-containing layer on the uppermost surface of the fourth layer.

Moreover, in the second sequence, Steps 1 to 4 are set as being included in one cycle, which is performed a predetermined number of times. That is, Step 1 of supplying the $NH_3$ gas and Step 2 of supplying the HCDS gas are sequentially performed in succession, and Step 3 of supplying the $C_3H_6$ gas and Step 4 of supplying the $O_2$ gas are not performed between Step 1 and Step 2. As described above, by performing Step 1 in the first cycle, the uppermost surface of the wafer 200 is changed (modified) into a surface state in which it is easy for the HCDS gas to be adsorbed onto the uppermost surface, and it is easy for Si to be deposited on the uppermost surface. Step 3 or Step 4 is not performed between Step 1 and Step 2, and thus, the uppermost surface of the wafer 200 is maintained in a surface state in which it is easy for the HCDS gas to be adsorbed onto the uppermost surface, and it is easy for Si to be deposited on the uppermost surface. Accordingly, in Step 2 performed immediately after Step 1, adsorption of the HCDS gas or deposition of Si onto the uppermost surface of the wafer 200 is facilitated, and it is facilitated to form a silicon-containing layer on the uppermost surface of the wafer 200.

Moreover, in the second sequence, Steps 1 to 4 are set as being included in one cycle, and when the one cycle is performed a plurality of times, the uppermost surface of the fourth layer formed by performing Step 1 is changed (modified) into a surface state in which it is easy for the HCDS gas to be adsorbed onto the uppermost surface, and it is easy for Si to be deposited on the uppermost surface. Step 3 or Step 4 is not performed between Step 1 and Step 2, and thus, the uppermost surface of the fourth layer is maintained in a surface state in which it is easy for the HCDS gas to be adsorbed onto the uppermost surface, and it is easy for Si to be deposited on the uppermost surface. Accordingly, in Step 3 performed immediately after Step 2, adsorption of the HCDS gas or deposition of Si onto the uppermost surface of the fourth layer is facilitated, and it is facilitated to form a silicon-containing layer on the uppermost surface of the fourth layer.

As described above, in all of the film-forming sequences, it can be facilitated to form a silicon-containing layer on the uppermost surface of the wafer 200. Accordingly, even in the low temperature range, a deposition rate of the SiOCN film can increase, thus enhancing a productivity of film-forming processing.

(b) According to some embodiments, in all of the film-forming sequences, when completing the process of forming the SiOCN film, the process of supplying the $NH_3$ gas is finally performed. That is, in the first film-forming sequence, the activated $NH_3$ gas is supplied to the wafer 200 in Step 4 that is performed in the final stage of each cycle. Also, in the second film-forming sequence, the cycle including Steps 1 to 4 is performed a predetermined number of times, and then the nitridation step of supplying the activated $NH_3$ gas to the wafer 200 is performed. Accordingly, the uppermost surface of the SiOCN film can be appropriately nitrided to thereby be modified, and thus, the finally formed SiOCN film can have a uniform composition in a film-thickness direction.

(c) By rearranging the supply sequence of gases as in the above-described first sequence or second sequence, the above-described effects can be obtained without changing the existing structure of the substrate processing apparatus, the existing film-forming temperature, and the existing kind and flow rate of the gases.

Moreover, at an initial state, an SiO film or a SiON film was considered, instead of the SiOCN film, for forming by oxidizing and then nitriding a layer having Si—C bonding. Such films were considered since bonding energy of Si—O bonding is greater than that of Si—N bonding or Si—C bonding, Si—C bonding of a layer having Si—C bonding is broken when Si—O bonding is formed in oxidizing a layer having Si—C bonding, for which reason C that is decoupled from Si desorbs from the layer having Si—C bonding, and it is difficult to form Si—N bonding even when nitridation is performed after the desorption. For this reason, it was considered that when the supply sequence of gases is rearranged, for example, like the above-described first sequence or second sequence, it is not possible to form the SiOCN film because C is all desorbed (i.e., the SiO film or the SiON film is formed.). The oxidizing power (especially, a dilution rate of an oxidizing gas, a supply time, and a partial pressure) was found to be controlled when the layer having Si—C bonding is oxidized and then nitrided, and thus enables C, desorbed from the layer having Si—C bonding due to oxidation, to remain. Moreover, the SiOCN film can be formed by forming Si—N bonding through nitridation subsequent thereto. According to the film-forming sequence described above, the above-described effects can be obtained at low cost without much change to the existing substrate processing apparatus.

(d) According to some embodiments, in all of the first sequence and the second sequence, a SiOCN film having an in-plane good uniformity of a film thickness of a wafer can be formed. Furthermore, when the SiOCN film formed by the first sequence or second sequence is used as an insulating film, it becomes possible to provide an in-plane uniform performance of the SiOCN film, and it becomes possible to contribute to enhance a performance or yield rate of semiconductor devices.

(e) According to some embodiments, a ratio of element components of the SiOCN film, namely, a ratio of a silicon component, an oxygen component, a carbon component, and a nitrogen component, namely, a silicon concentration, an oxygen concentration, a carbon concentration, and a nitrogen concentration, may be regulated by controlling processing conditions such as the internal pressure of the processing chamber 201, a gas supply time, or the like in each step of each sequence, thereby controlling a composition ratio of the SiOCN film.

(f) According to some embodiments, since a SiOCN film having a predetermined composition can be formed, it becomes possible to control an etching resistance, a dielectric constant, and an insulating resistance, and since the SiOCN film has a dielectric constant lower than that of a SiN film, it becomes possible to form a silicon insulating film having a good etching resistance and a good insulating resistance.

(g) In surface modification step and Steps 2 to 4 of the first sequence and Steps 1, 3 and 4 and nitridation step of the second sequence, the $C_3H_6$ gas, the $O_2$ gas, and the $NH_3$ gas are activated by heat, and supplied to the wafer 200. Accordingly, the above-described reactions can be softly caused, and thus, formation, oxidation, and nitridation of a carbon-containing layer can be easily performed in good controllability.

(h) By using the silicon insulating film, as a sidewall spacer, it is possible to provide technology for forming a device having a good processability and a low leak current.

(i) By using the silicon insulating film, as an etch stopper, it is possible to provide technology for forming a device having a good processability.

(j) According to some embodiments, the silicon insulating film having an ideal stoichiometric mixture ratio can be formed without using plasma. In addition, since the silicon insulating film can be formed without using plasma, it is possible to provide technology that can be applied to a process having a probability of plasma damage, for example, an SADP film of DPT.

<Additional Embodiments>

Hereinabove, various embodiments of the present disclosure has been specifically described, but the present disclosure is not limited to the above-described embodiments, and may be varied without departing from the spirit of the present disclosure.

Figure 4B:
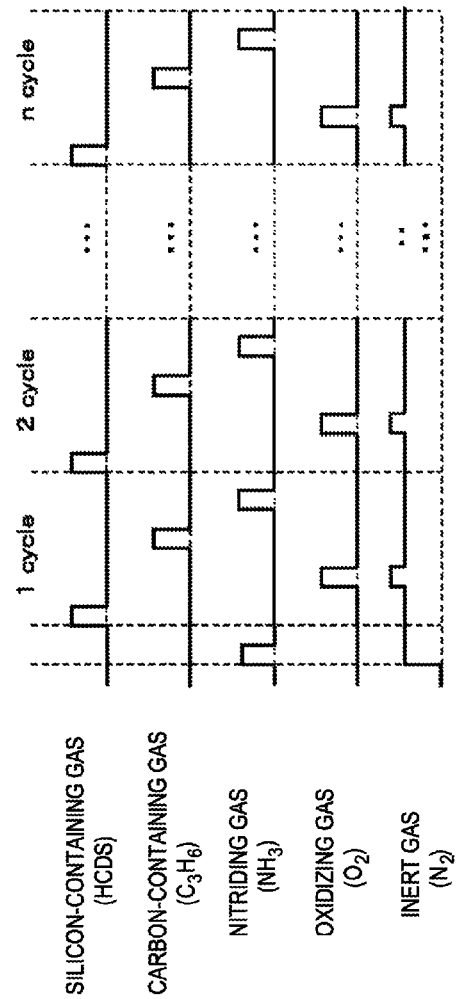

For example, in the above-described first sequence, the process (surface modification step) of supplying the $NH_3$ gas is performed, and then the cycle, in which the process (Step 1) of supplying the HCDS gas, the process (Step 2) of supplying the $C_3H_6$ gas, the process (Step 3) of supplying the $O_2$ gas, and the process (Step 4) of supplying the $NH_3$ are sequentially performed, is performed a predetermined number of times. However, the present disclosure is not limited the aspect. For example, as in FIG. 4B that shows a modification example of the first sequence, the surface modification step may be performed, and then a cycle in which Steps 1, 3, 2 and 4 are sequentially performed may be performed a predetermined number of times. That is, any one of the process (Step 2) of supplying the carbon-containing gas and the process (Step 3) of supplying the oxidizing gas may be first performed. However, the first sequence of FIG. 4A in which Step 2 is performed prior to Step 3 can increase a deposition rate more than the modification example of the first sequence of FIG. 4B in which Step 3 is performed prior to Step 2.

Moreover, for example, in the above-described second sequence, the cycle in which the process (Step 1) of supplying the $NH_3$ gas, the process (Step 2) of supplying the HCDS gas, the process (Step 3) of supplying the $C_3H_6$ gas, and the process (Step 4) of supplying the $O_2$ gas are sequentially performed is performed a predetermined number of times, and then the process (nitridation step) of supplying the $NH_3$ is performed. However, the present disclosure is not limited the aspect. For example, as in FIG. 5B that shows a modification example of the second sequence, a cycle in which Steps 1, 2, 4 and 3 are sequentially performed may be performed a predetermined number of times, and then the nitridation step may be performed. That is, any one of the process (Step 3) of supplying the carbon-containing gas and the process (Step 4) of supplying the oxidizing gas may be first performed. However, the second sequence of FIG. 5A in which Step 3 is performed prior to Step 4 can increase a deposition rate more than the modification example of the first sequence of FIG. 5B in which Step 4 is performed prior to Step 3.

Moreover, for example, the buffer chamber 237 may not be installed in the processing chamber 201, and the $NH_3$ gas may be directly supplied from the fourth nozzle 249d into the processing chamber 201. In this case, the gas supply holes 250d of the fourth nozzle 249d may be opened toward a center of the reaction tube 203, and thus, the $NH_3$ gas from the fourth nozzle 249d may be directly supplied toward the wafer 200. Also, the fourth nozzle 249d may not be provided, and only the buffer chamber 237 may be provided.

Moreover, for example, the $C_3H_6$ gas, the $O_2$ gas, and the $NH_3$ gas are not limited to a case in which the gases are activated by heat, and as another example, the $C_3H_6$ gas, the $O_2$ gas, and the $NH_3$ gas may be activated using plasma. In this case, for example, the gases may be plasma-excited using the above-described plasma source that is the plasma generator. When the gases are plasma-excited and supplied, a film-forming temperature can be more lowered. However, when the gases are not plasma-excited but are activated by heat as in the above-described embodiments, particles can be prevented from occurring in the processing chamber 201, and moreover, plasma damage of the members or the wafers 200 in the processing chamber 201 can be avoided.

Moreover, for example, in Step 3 of the first sequence and Step 4 of the second sequence, a reducing gas such as a hydrogen-containing gas may be supplied together with the oxidizing gas. When the oxidizing gas and the reducing gas are supplied into the processing chamber 201 under a low atmosphere pressure (depressurization) lower than the atmospheric pressure, the oxidizing gas and the reducing gas may react with each other in the processing chamber 201 to generate oxidative species that contains oxygen such as atomic oxygen but contains no water ($H_2O$), and the layers may be oxidized by the oxidative species. In this case, the layers can be oxidized at oxidizing power higher than a case in which the layers are oxidized by the oxidizing gas. The oxidation is performed under a pressurization atmosphere of non-plasma. The reducing gas may use, for example, hydrogen ($H_2$) gas.

Moreover, for example, in the above-described embodiments, an example which forms the SiOCN film (semiconductor insulating film) containing silicon (semiconductor element) as a thin film has been described above, but the present disclosure may be applied to a case which forms a metal oxycarbonitride film (metal insulating film) containing metal elements such as titanium (Ti), zirconium (Zr), hafnium (Hf), tantalum (Ta), aluminum (Al), molybdenum (Mo), gallium (Ga), germanium (Ge), etc.

For example, the present disclosure may be applied to a case which forms a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), a molybdenum oxycarbonitride film (MoOCN film), a gallium oxycarbonitride film (GaOCN film), a germanium film (GeOCN film), or a metal oxycarbonitride film formed by combination or mixing thereof.

In this case, a film may be formed by a sequence (for example, the first sequence, the second sequence, or the modification example thereof) similar to the above-described embodiments by using a metal element-containing raw material gas (gas containing a metal element) such as a titanium raw material gas, a zirconium raw material gas, a hafnium raw material gas, a tantalum raw material gas, an aluminum raw material gas, a molybdenum raw material gas, a gallium raw material gas, a germanium raw material gas, or the like, instead of a silicon raw material gas in the above-described embodiments.

That is, in this case, the process of supplying the nitriding gas to the wafer is performed, and then a cycle including supplying the metal element-containing gas to the wafer, supplying the carbon-containing gas to the wafer, and supplying the oxidizing gas to the wafer, and supplying the nitriding gas to the wafer is performed a predetermined number of times, thereby forming a thin film (metal oxycarbonitride film) containing a metal element, oxygen, carbon, and nitrogen on the wafer. In the act of forming the metal oxycarbonitride film, the act of supplying the nitriding gas is performed before performing the process of supplying the metal element-containing gas, and the act of supplying the carbon-containing gas and the act of supplying the oxidizing gas are not performed until the act of supplying the metal element-containing gas is performed after the act of supplying the nitriding gas is performed.

For example, when a TiOCN film is formed as the metal oxycarbonitride film, a raw material containing Ti may use an organic raw material such as tetrakis(ethylmethylamino)titanium (Ti[N($C_2H_5$)($CH_3$)]$_4$, abbreviation: TEMAT), tetrakis (dimethylamino)titanium (Ti[N($CH_3$)$_2$]$_4$, abbreviation: TDMAT), tetrakis(diethylamido)titanium (Ti[N($C_2H_5$)$_2$]$_4$, abbreviation: TDEAT), or the like, or use an inorganic raw material such as titanium tetrachloride ($TiCl_4$) or the like. A gas similar to the above-described embodiments may be used as the carbon-containing gas, the oxidizing gas, or the nitriding gas. Also, in this case, processing conditions may be similar to the above-described embodiments. However, the wafer temperature may be set to fall within a range of, for example, 100 to 500 degrees C., and the pressure in the processing chamber may be set to fall within a range of, for example, 1 to 3,000 Pa.

Moreover, for example, when a ZrOCN film is formed as the metal oxycarbonitride film, a raw material containing Zr may use an organic raw material such as tetrakis(ethylmethylamino)zirconium (Zr[N($C_2H_5$)($CH_3$)]$_4$, abbreviation: TEMAZ), tetrakis(dimethylamino)zirconium (Zr[N($CH_3$)$_2$]$_4$, abbreviation: TDMAZ), tetrakis(diethylamido)zirconium (Zr[N($C_2H_5$)$_2$]$_4$, abbreviation: TDEAZ), or the like, or use an inorganic raw material such as zirconium tetrachloride ($ZrCl_4$) or the like. A gas similar to the above-described embodiments may be used as the carbon-containing gas, the oxidizing gas, or the nitriding gas. Also, in this case, processing conditions may be similar to the above-described embodiments. However, the wafer temperature may be set to fall within a range of, for example, 100 to 400 degrees C., and the pressure in the processing chamber may be set to fall within a range of, for example, 1 to 3,000 Pa.

Moreover, for example, when a HfOCN film is formed as the metal oxycarbonitride film, a raw material containing Hf may use an organic raw material such as tetrakis(ethylmethylamino)hafnium (Hf[N($C_2H_5$)($CH_3$)]$_4$, abbreviation: TEMAH), tetrakis(dimethylamino)hafnium (Hf[N($CH_3$)$_2$]$_4$, abbreviation: TDMAH), tetrakis(diethylamido)hafnium (Hf[N($C_2H_5$)$_2$]$_4$, abbreviation: TDEAH), or the like, or use an inorganic raw material such as hafnium tetrachloride ($HfCl_4$) or the like. A gas similar to the above-described embodiments may be used as the carbon-containing gas, the oxidizing gas, or the nitriding gas. Also, in this case, processing conditions may be similar to the above-described embodiments. However, the wafer temperature may be set to fall within a range of, for example, 100 to 400 degrees C., and the pressure in the processing chamber may be set to fall within a range of, for example, 1 to 3,000 Pa.

Moreover, for example, when a TaOCN film is formed as the metal oxycarbonitride film, a raw material containing Ta may use an organic raw material such as tert-butylimido tris-diethylamino tantalum (Ta[N($C_2H_5$)$_2$]$_3$[NC($CH_3$)$_3$], abbreviation: TBTDET), tert-butylimino tri(ethylmethylamino)tantalum (Ta[NC($CH_3$)$_3$][N($C_2H_5$)$CH_3$]$_3$), abbreviation: TBTEMT), or the like, or use an inorganic raw material such as tantalum pentachloride ($TaCl_5$) or the like. A gas similar to the above-described embodiments may be used as the carbon-containing gas, the oxidizing gas, or the nitriding gas. Also, in this case, processing conditions may be similar to the above-described embodiments. However, the wafer temperature may be set to fall within a range of, for example, 100 to 500 degrees C., and the pressure in the processing chamber may be set to fall within a range of, for example, 1 to 3,000 Pa.

Moreover, for example, when an AlOCN film is formed as the metal oxycarbonitride film, a raw material containing Al may use an organic raw material such as trimethyl aluminum (Al($CH_3$)$_3$, abbreviation: TMA) or the like, or use an inorganic raw material such as aluminum trichloride ($AlCl_3$) or the like. A gas similar to the above-described embodiments may be used as the carbon-containing gas, the oxidizing gas, or the nitriding gas. Also, in this case, processing conditions may be similar to the above-described embodiments. However, the wafer temperature may be set to fall within a range of, for example, 100 to 400 degrees C., and the pressure in the processing chamber may be set to fall within a range of, for example, 1 to 3,000 Pa.

Moreover, for example, when a MoOCN film is formed as the metal oxycarbonitride film, a raw material containing Mo may use an inorganic raw material such as molybdenum pentachloride ($MoCl_5$) or the like. A gas similar to the above-described embodiments may be used as the carbon-containing gas, the oxidizing gas, or the nitriding gas. Also, in this case, processing conditions may be similar to the above-described embodiments. However, the wafer temperature may be set to fall within a range of, for example, 100 to 500 degrees C., and the pressure in the processing chamber may be set to fall within a range of, for example, 1 to 3,000 Pa.

As described above, the present disclosure may also be applied to formation of the metal oxycarbonitride film, in which case effects similar to one or more of the above-mentioned embodiments can be obtained. That is, the present disclosure may be applied to a case which forms the oxycarbonitride film containing a specific element such as a semiconductor element, a metal element, or the like.

Moreover, an example in which the thin film is formed using a batch type substrate processing apparatus in which a plurality of substrates are processed at a time has been described, but the present disclosure is not limited thereto but may be applied to a case in which the thin film is formed using a single-wafer type substrate processing apparatus in which one or several substrates are processed at a time.

Moreover, the above-described embodiments, modification examples, and application examples may be appropriately combined and used.

In addition, the present disclosure is realized by varying, for example, a process recipe of the substrate processing apparatus of the related art. When the process recipe is varied, the process recipe according to the present disclosure may be installed at the substrate processing apparatus of the related art via an electrical communication line or a non-transitory computer-readable recording medium in which the process recipe is recorded, or the process recipe itself may be changed to the process recipe according to the present disclosure by manipulating an input/output device of the substrate processing apparatus of the related art.

EXAMPLE

Figure 6B:
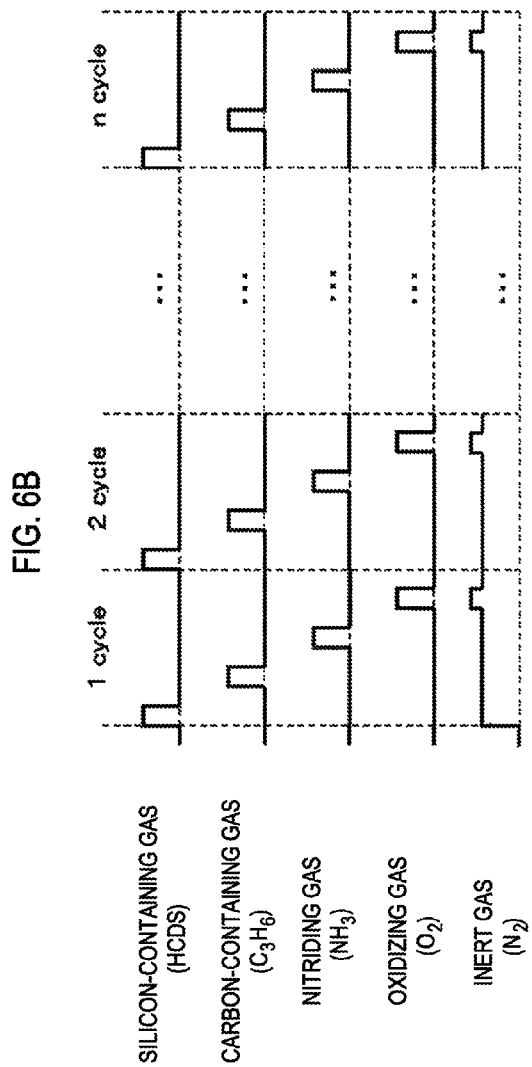

As an example of the present disclosure, the substrate processing apparatus of FIGS. 1 and 2 is used, and a SiOCN film is formed on a plurality of wafers by the first sequence described previously. FIG. 6A is a view showing a gas supply timing in the example. The HCDS gas is used as the silicon-containing gas, the $C_3H_6$ gas is used as the carbon-containing gas, the $O_2$ gas is used as the oxidizing gas, and the $NH_3$ gas is used as the nitriding gas. A wafer temperature in film-forming is set to 600 to 650 degrees C. Also, a gas supply time of the $NH_3$ gas in a surface modification step is set longer by four times than a gas supply time of the $NH_3$ gas in Step 4. Also, in order for oxidizing power in Step 3 to be weakened, a flow rate of the $N_2$ gas supplied into the processing chamber increases by about 3%, and a partial pressure of the $O_2$ gas in the processing chamber decreases. Other processing conditions are respectively set to predetermined values within the processing conditions described above. In addition, a film thickness of the SiOCN film formed on the wafers is measured.

Moreover, as a comparative example, the substrate processing apparatus of FIGS. 1 and 2 is used, and a SiOCN film is formed on a plurality of wafers by a film-forming sequence in which a cycle, in which a step of supplying HCDS gas to the wafers, a step of supplying $C_3H_6$ gas to the wafers, a step of supplying $NH_3$ gas to the wafers, and a step of supplying $O_2$ gas to the wafers are sequentially performed, is performed a predetermined number of times. In the comparative example, only a supply sequence of gases differs from the above-described example. That is, except for the supply sequence of gases, processing conditions of the comparative example is the same as those of the above-described example. Furthermore, a film thickness of the SiOCN film formed on the wafers is measured.

Figure 7:
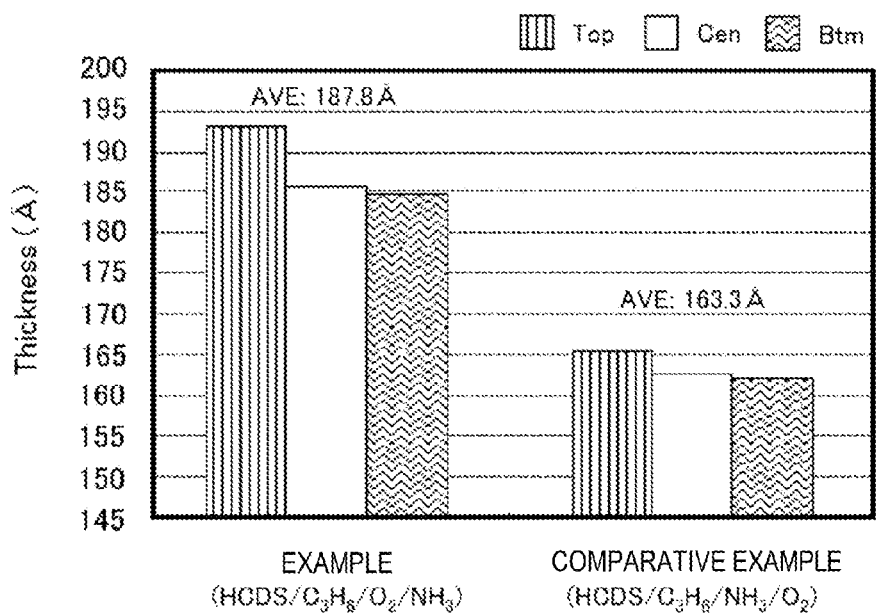
FIG. 7 is a view showing measurement results of film thicknesses of SiOCN films in the example of the present disclosure and the comparative example.

FIG. 7 is a view showing a measurement result of film thicknesses of the SiOCN films in the example and comparative example of the present disclosure. The ordinate axis of FIG. 7 indicates an in-plane average film thickness value Å of the SiOCN film (formed on the wafer) in the wafer, and the abscissa axis indicates the example and the comparative example. In FIG. 7, the term "Top" indicates a measurement result of a wafer disposed at an upper portion of a boat, the term "Cen" indicates a measurement result of a wafer disposed at a central portion of the boat, and the term "Btm" indicates a measurement result of a wafer disposed at a lower portion of the boat.

As shown in FIG. 7, the film thickness of the SiOCN film in the example is an average (average in all of Top to Btm) of 187.8 Å, and the film thickness of the SiOCN film in the comparative example is an average of 163.3 Å. It can be seen that a deposition rate in the example increases by 15% compared to a deposition rate in the comparative example. The reason that processing conditions in the respective steps of supplying the HCDS gas, the $C_3H_6$ gas, the $O_2$ gas, and the $NH_3$ gas are the same is because the deposition rate of the SiOCN film depends on a thickness of a silicon-containing layer formed per one cycle. In the example, the uppermost surface of the wafer or the uppermost surface of the fourth layer, which is a plane for the HCDS gas or Si to be adsorbed thereon or a plane (basic plane) for the HCDS gas or Si to be deposited thereon, is supplied with the $NH_3$ gas to thereby be modified to a surface state (surface state in which a nitride layer, an adsorption layer of the $NH_3$ gas, or all of these is/are formed on the uppermost surface) in which it is easy for the HCDS gas or Si to be adsorbed or deposited onto the uppermost surface. On the other than, in the comparative example, the step of supplying the $NH_3$ gas is not performed before starting to perform the cycle, and when the cycle is repeated, the step of supplying the $O_2$ gas and the step of supplying the HCDS gas are successively performed, whereby a plane for the HCDS gas or Si to be adsorbed thereon or a plane (basic plane) for the HCDS gas or Si to be deposited thereon has relatively sufficient oxygen. A difference of the surface states is considered to be a factor that causes a difference of adsorption amounts or deposition amounts of HCDS gas or Si per one cycle, and thus increases a deposition rate in the example.

<Further Additional Aspects of Present Disclosure>

Hereinafter, some aspects of the present disclosure will be additionally stated.

An aspect of the present disclosure provides a method of manufacturing a semiconductor device, including forming a thin film containing a specific element, oxygen, carbon, and nitrogen on a substrate by performing a cycle a predetermined number of times, the cycle including: supplying a specific element-containing gas to the substrate; supplying a carbon-containing gas to the substrate; supplying an oxidizing gas to the substrate; and supplying a nitriding gas to the substrate, wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

In some embodiments, in the act of forming the thin film, the act of supplying the nitriding gas is performed, and then the cycle including supplying the specific element-containing gas, supplying the carbon-containing gas, supplying the oxidizing gas, and supplying the nitriding gas is performed a predetermined number of times.

In some embodiments, in the act of forming the thin film, the act of supplying the nitriding gas is performed, and then the cycle, in which the act of supplying the specific element-containing gas, the act of supplying the carbon-containing gas, the act of supplying the oxidizing gas, and the act of supplying the nitriding gas are sequentially performed, is performed a predetermined number of times.

In some embodiments, in the act of forming the thin film, the cycle including supplying the nitriding gas, supplying the specific element-containing gas, supplying the carbon-containing gas, and supplying the oxidizing gas is performed a predetermined number of times, and then the act of supplying the nitriding gas is performed.

In some embodiments, in the act of forming the thin film, the cycle, in which the act of supplying the nitriding gas, the act of supplying the specific element-containing gas, the act of supplying the carbon-containing gas, and the act of supplying the oxidizing gas are sequentially performed, is performed a predetermined number of times, and then the act of supplying the nitriding gas is performed.

In some embodiments, in the act of forming the thin film, an uppermost surface of the substrate is modified by supplying the nitriding gas, and a specific element-containing layer containing the specific element is formed on the uppermost surface of the substrate modified by the nitriding gas by supplying the specific element-containing gas.

In some embodiments, in the act of forming the thin film, an uppermost surface of the substrate is modified by supplying the nitriding gas, a specific element-containing layer containing the specific element is formed on the uppermost surface of the substrate modified by the nitriding gas by supplying the specific element-containing gas, a carbon-containing layer is formed on the specific element-containing layer by supplying the carbon-containing gas, a layer in which the carbon-containing layer is formed on the specific element-containing layer is oxidized by supplying the oxidizing gas to form a layer containing the specific element, oxygen, and carbon, and then the layer containing the specific element, oxygen, and carbon is nitrided by supplying the nitriding gas to form the layer containing the specific element, oxygen, carbon, and nitrogen, and an uppermost surface of the formed layer may be modified.

In some embodiments, when an uppermost surface of the substrate is modified by supplying the nitriding gas, the uppermost surface of the substrate is nitrided, or the nitriding gas is adsorbed onto the uppermost surface of the substrate.

In some embodiments, the specific element is a semiconductor element or a metal element.

In some embodiments, the specific element is silicon.

Another aspect of the present disclosure provides a method of manufacturing a semiconductor device, including forming a thin film containing a specific element, oxygen, carbon, and nitrogen on a substrate by performing a cycle a predetermined number of times, the cycle including: supplying a specific element-containing gas to the substrate; supplying a carbon-containing gas to the substrate; supplying an oxidizing gas to the substrate; and supplying a nitriding gas to the substrate, wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

Another aspect of the present disclosure provides a substrate processing apparatus including: a processing chamber configured to accommodate a substrate; a specific element-containing gas supply system configured to supply a specific element-containing gas to the substrate in the processing chamber; a carbon-containing gas supply system configured to supply a carbon-containing gas to the substrate in the processing chamber; an oxidizing gas supply system configured to supply an oxidizing gas to the substrate in the processing chamber; a nitriding gas supply system configured to supply a nitriding gas to the substrate in the processing chamber; and a controller configured to control the specific element-containing gas supply system, the carbon-containing gas supply system, the oxidizing gas supply system, and the nitriding gas supply system such that a thin film containing a specific element, oxygen, carbon, and nitrogen is formed on the substrate by performing a cycle a predetermined number of times, the cycle including supplying the specific element-containing gas to the substrate, supplying the carbon-containing gas to the substrate, supplying the oxidizing gas to the substrate, and supplying the nitriding gas to the substrate, and in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

Another aspect of the present disclosure provides a program that causes a computer to perform a process of forming a thin film containing a specific element, oxygen, carbon, and nitrogen on a substrate by performing a cycle a predetermined number of times, the cycle including: supplying a specific element-containing gas to the substrate; supplying a carbon-containing gas to the substrate; supplying an oxidizing gas to the substrate; and supplying a nitriding gas to the substrate, wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

Another aspect of the present disclosure provides a non-transitory computer-readable recording medium storing program that causes a computer to perform a process of forming a thin film containing a specific element, oxygen, carbon, and nitrogen on a substrate by performing a cycle a predetermined number of times, the cycle including: supplying a specific element-containing gas to the substrate; supplying a carbon-containing gas to the substrate; supplying an oxidizing gas to the substrate; and supplying a nitriding gas to the substrate, wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed. According to a method of manufacturing a semiconductor device, a substrate processing apparatus, and a recording medium according to the present disclosure, a deposition rate can be prevented from being reduced when forming a thin film, including a specific element, oxygen, carbon, and nitrogen, in a low temperature range.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a thin film containing a specific element, oxygen, carbon, and nitrogen on a substrate by performing a cycle a predetermined number of times, the cycle comprising:
    supplying a specific element-containing gas to the substrate;
    supplying a carbon-containing gas to the substrate;
    supplying an oxidizing gas to the substrate; and
    supplying a nitriding gas to the substrate,
    wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

2. The method of claim 1, wherein in the act of forming the thin film,
    the act of supplying the nitriding gas is performed, and the cycle comprising supplying the specific element-containing gas, supplying the carbon-containing gas, supplying the oxidizing gas, and supplying the nitriding gas is performed a predetermined number of times.

3. The method of claim 1, wherein in the act of forming the thin film,
    the act of supplying the nitriding gas is performed, and the cycle, in which the act of supplying the specific element-containing gas, the act of supplying the carbon-containing gas, the act of supplying the oxidizing gas, and the act of supplying the nitriding gas are sequentially performed, is performed a predetermined number of times.

4. The method of claim 1, wherein in the act of forming the thin film,
    the cycle comprising supplying the nitriding gas, supplying the specific element-containing gas, supplying the carbon-containing gas, and supplying the oxidizing gas is performed a predetermined number of times, and the act of supplying the nitriding gas is performed.

5. The method of claim 1, wherein in the act of forming the thin film,
    the cycle, in which the act of supplying the nitriding gas, the act of supplying the specific element-containing gas, the act of supplying the carbon-containing gas, and the act of supplying the oxidizing gas are sequentially performed, is performed a predetermined number of times, and the act of supplying the nitriding gas is performed.

6. The method of claim 1, wherein in the act of forming the thin film,
    an uppermost surface of the substrate is modified by supplying the nitriding gas, and
    a specific element-containing layer containing the specific element is formed on the uppermost surface of the substrate modified by the nitriding gas by supplying the specific element-containing gas.

7. The method of claim 1, wherein in the act of forming the thin film,
    an uppermost surface of the substrate is modified by supplying the nitriding gas,
    a specific element-containing layer containing the specific element is formed on the uppermost surface of the substrate modified by the nitriding gas by supplying the specific element-containing gas,
    a carbon-containing layer is formed on the specific element-containing layer by supplying the carbon-containing gas,
    a layer in which the carbon-containing layer is formed on the specific element-containing layer is oxidized by supplying the oxidizing gas to form a layer containing the specific element, oxygen, and carbon, and
    the layer containing the specific element, oxygen, and carbon is nitrided by supplying the nitriding gas to form the layer containing the specific element, oxygen, carbon, and nitrogen, and an uppermost surface of the layer is modified.

8. The method of claim 6, wherein when the uppermost surface of the substrate is modified by supplying the nitriding gas, the uppermost surface of the substrate is nitrided, or the nitriding gas is adsorbed onto the uppermost surface of the substrate.

9. The method of claim 1, wherein the specific element is a semiconductor element or a metal element.

10. The method of claim 1, wherein the specific element is silicon.

11. A substrate processing apparatus, comprising:
    a processing chamber configured to accommodate a substrate;
    a specific element-containing gas supply system configured to supply a specific element-containing gas to the substrate in the processing chamber;
    a carbon-containing gas supply system configured to supply a carbon-containing gas to the substrate in the processing chamber;
    an oxidizing gas supply system configured to supply an oxidizing gas to the substrate in the processing chamber;
    a nitriding gas supply system configured to supply a nitriding gas to the substrate in the processing chamber; and
    a controller configured to control the specific element-containing gas supply system, the carbon-containing gas supply system, the oxidizing gas supply system, and the nitriding gas supply system such that a thin film containing a specific element, oxygen, carbon, and nitrogen is formed on the substrate by performing a cycle a predetermined number of times, the cycle comprising supplying the specific element-containing gas to the substrate, supplying the carbon-containing gas to the substrate, supplying the oxidizing gas to the substrate, and supplying the nitriding gas to the substrate,
    wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

12. A non-transitory computer-readable recording medium storing a program that causes a computer to perform a process of forming a thin film containing a specific element, oxygen, carbon, and nitrogen on a substrate by performing a cycle a predetermined number of times, the cycle comprising:
supplying a specific element-containing gas to the substrate;
supplying a carbon-containing gas to the substrate;
supplying an oxidizing gas to the substrate; and
supplying a nitriding gas to the substrate,
wherein in the act of forming the thin film, the act of supplying the nitriding gas is performed before the act of supplying the specific element-containing gas, and the act of supplying the carbon-containing gas and the act of supplying the oxidizing gas are not performed until the act of supplying the specific element-containing gas is performed after the act of supplying the nitriding gas is performed.

* * * * *